(12) United States Patent
Yamaguchi et al.

(10) Patent No.: US 8,624,336 B2
(45) Date of Patent: Jan. 7, 2014

(54) SEMICONDUCTOR DEVICE AND MANUFACTURING METHOD THEREOF

(75) Inventors: Mayumi Yamaguchi, Kanagawa (JP); Konami Izumi, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 105 days.

(21) Appl. No.: 13/275,383

(22) Filed: Oct. 18, 2011

(65) Prior Publication Data

US 2012/0032304 A1 Feb. 9, 2012

Related U.S. Application Data

(63) Continuation of application No. 11/552,369, filed on Oct. 24, 2006, now Pat. No. 8,043,950.

(30) Foreign Application Priority Data

Oct. 26, 2005 (JP) ................................. 2005-312034

(51) Int. Cl.
*H01L 27/14* (2006.01)

(52) U.S. Cl.
USPC ......................................... 257/414; 257/252

(58) Field of Classification Search
USPC .................................. 257/414, 252
See application file for complete search history.

(56) References Cited

U.S. PATENT DOCUMENTS

| | | | |
|---|---|---|---|
| 5,461,916 A | 10/1995 | Fujii et al. | |
| 5,576,250 A | 11/1996 | Diem et al. | |
| 5,719,073 A | 2/1998 | Shaw et al. | |
| 5,930,594 A | 7/1999 | Vilain | |
| 5,949,119 A | 9/1999 | Vilain | |
| 6,004,830 A | 12/1999 | Potter | |
| 6,019,457 A | 2/2000 | Silverbrook | |
| 6,238,946 B1 | 5/2001 | Ziegler | |
| 6,388,300 B1 | 5/2002 | Kano et al. | |
| 6,391,674 B2 | 5/2002 | Ziegler | |
| 6,602,791 B2 | 8/2003 | Ouellet et al. | |
| 6,649,947 B2 | 11/2003 | Rodgers et al. | |
| 6,720,267 B1 | 4/2004 | Chen et al. | |
| 6,800,503 B2 | 10/2004 | Kocis et al. | |
| 6,903,861 B1 | 6/2005 | Allen | |

(Continued)

FOREIGN PATENT DOCUMENTS

| | | | |
|---|---|---|---|
| EP | 1254717 A1 | 11/2002 | |
| EP | 1529753 A2 | 5/2005 | |

(Continued)

*Primary Examiner* — Douglas Menz
(74) *Attorney, Agent, or Firm* — Fish & Richardson P.C.

(57) ABSTRACT

It is an object of the present invention to manufacture a micromachine having a plurality of structural bodies with different functions and to shorten the time required for sacrifice layer etching in a process of manufacturing the micromachine. Another object of the present invention is to prevent a structural layer from being attached to a substrate after the sacrifice layer etching. In other words, an object of the present invention is to provide an inexpensive and high-value-added micromachine by improving throughput and yield. The sacrifice layer etching is conducted in multiple steps. In the multiple steps of the sacrifice layer etching, a part of the sacrifice layer that does not overlap with the structural layer is removed by the earlier sacrifice layer etching and a part of the sacrifice layer that is under the structural layer is removed by the later sacrifice layer etching.

14 Claims, 34 Drawing Sheets

(56) References Cited

U.S. PATENT DOCUMENTS

| | | |
|---|---|---|
| 6,936,524 B2 | 8/2005 | Zhu et al. |
| 7,049,051 B2 | 5/2006 | Gabriel et al. |
| 7,081,647 B2 | 7/2006 | Mushika |
| 7,083,997 B2 | 8/2006 | Brosnihan et al. |
| 7,141,476 B2 | 11/2006 | Dao |
| 7,261,825 B2 | 8/2007 | Metzger et al. |
| 7,405,852 B2 | 7/2008 | Brosnihan et al. |
| 7,535,325 B2 | 5/2009 | Mueller-Fiedler et al. |
| 7,541,584 B2 | 6/2009 | Antoszewski et al. |
| 7,642,114 B2 | 1/2010 | Yamaguchi et al. |
| 7,660,058 B2 | 2/2010 | Qiu et al. |
| 7,683,429 B2 | 3/2010 | Yamaguchi et al. |
| 7,719,068 B2 | 5/2010 | Lee et al. |
| 7,732,241 B2 | 6/2010 | Yamaguchi et al. |
| 7,741,687 B2 | 6/2010 | Yamaguchi et al. |
| 7,749,793 B2 | 7/2010 | Elliott et al. |
| 2002/0047172 A1 | 4/2002 | Reid |
| 2002/0151100 A1 | 10/2002 | Coffa et al. |
| 2002/0160561 A1 | 10/2002 | Ouellet et al. |
| 2003/0036215 A1 | 2/2003 | Reid |
| 2003/0048149 A1 | 3/2003 | Deligianni et al. |
| 2003/0119221 A1 | 6/2003 | Cunningham et al. |
| 2004/0141224 A1 | 7/2004 | Huibers |
| 2004/0264846 A1 | 12/2004 | Nakata et al. |
| 2005/0168910 A1 | 8/2005 | Won et al. |
| 2005/0225921 A1 | 10/2005 | Nakatani et al. |
| 2005/0242687 A1* | 11/2005 | Kawakubo et al. ........... 310/324 |
| 2006/0017533 A1 | 1/2006 | Jahnes et al. |
| 2006/0038182 A1 | 2/2006 | Rogers et al. |
| 2006/0063351 A1 | 3/2006 | Jain |
| 2006/0096944 A1 | 5/2006 | Metzger et al. |
| 2006/0207964 A1 | 9/2006 | Chen et al. |
| 2006/0226114 A1 | 10/2006 | Fischer et al. |
| 2006/0284183 A1 | 12/2006 | Izumi et al. |
| 2007/0002156 A1 | 1/2007 | Hagood et al. |
| 2007/0015361 A1 | 1/2007 | Tateishi |
| 2007/0082493 A1 | 4/2007 | Nishiyama et al. |
| 2007/0093045 A1 | 4/2007 | Yamaguchi et al. |
| 2007/0206267 A1 | 9/2007 | Tung et al. |
| 2007/0211257 A1 | 9/2007 | Kearl et al. |
| 2007/0215963 A1 | 9/2007 | Yamaguchi et al. |
| 2008/0003784 A1 | 1/2008 | Pan |
| 2008/0063566 A1 | 3/2008 | Matsumoto et al. |
| 2009/0321644 A1 | 12/2009 | Vogt et al. |
| 2010/0072577 A1 | 3/2010 | Nuzzo et al. |
| 2010/0133537 A1 | 6/2010 | Yamaguchi et al. |

FOREIGN PATENT DOCUMENTS

| | | |
|---|---|---|
| JP | 05037082 A | 2/1993 |
| JP | 09113534 A | 5/1997 |
| JP | 2000-058866 A | 2/2000 |
| JP | 2001094062 A | 4/2001 |
| JP | 2003-039396 A | 2/2003 |
| JP | 2004-001140 A | 1/2004 |
| JP | 2005-118943 A | 5/2005 |
| JP | 2005125484 A | 5/2005 |
| JP | 2005-161516 A | 6/2005 |
| JP | 2005166512 A | 6/2005 |

* cited by examiner

FIG. 8A  t=0
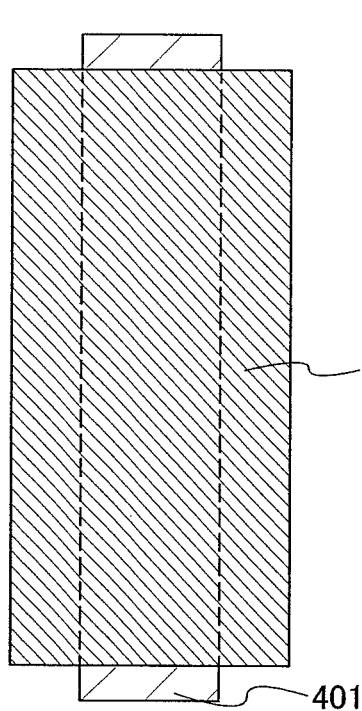
FIG. 8B  t<tmax
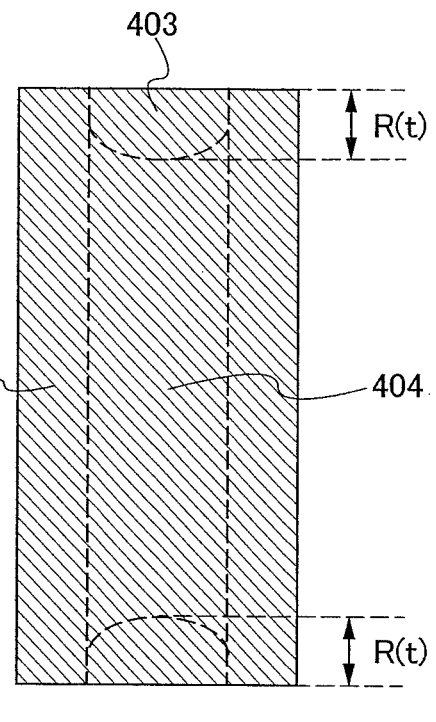
FIG. 8C  t>tmax
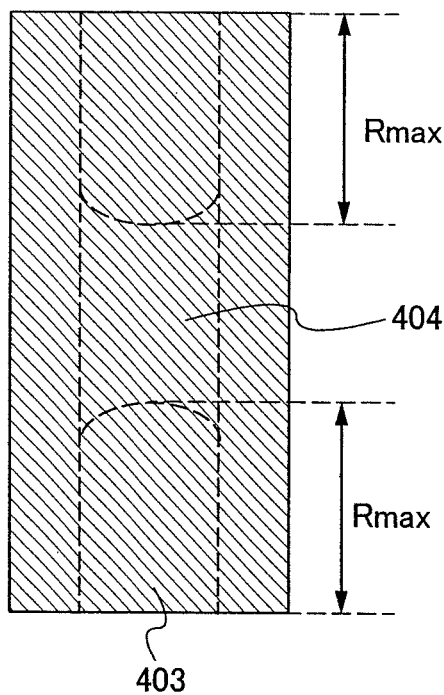

external force

701

702

703 → detect the change in an electronic capacitance mobile 705    704

FIG. 15A1
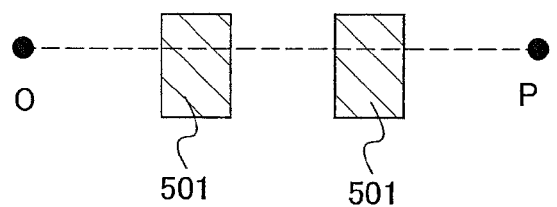
FIG. 15A2
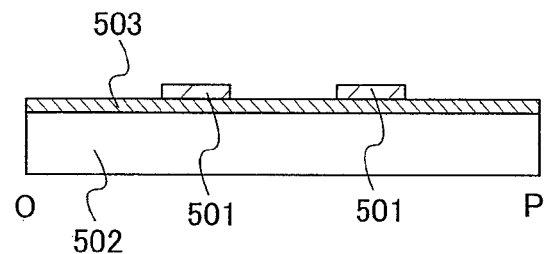
FIG. 15B1
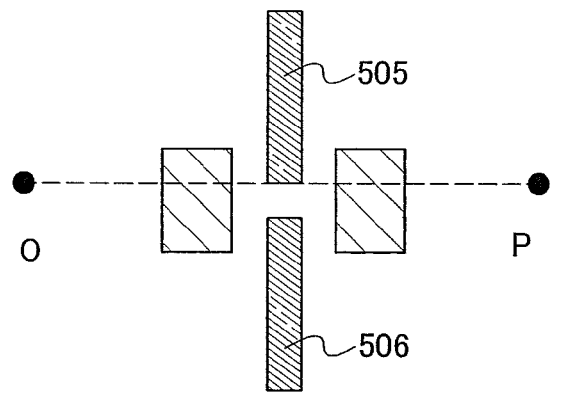
FIG. 15B2
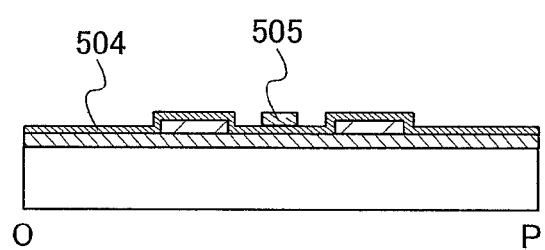
FIG. 15C1
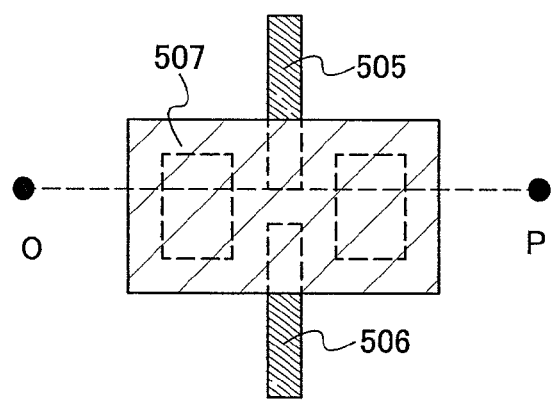
FIG. 15C2
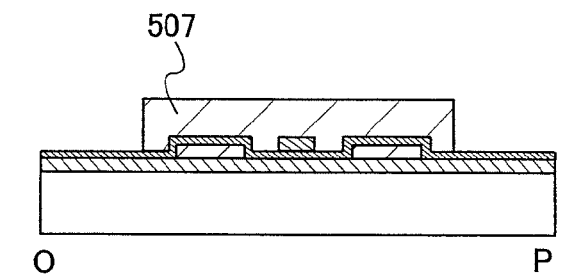

FIG. 16A1
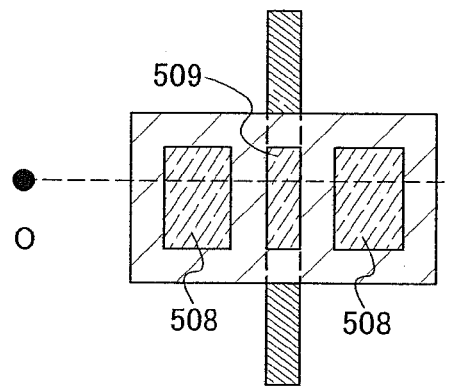
FIG. 16A2
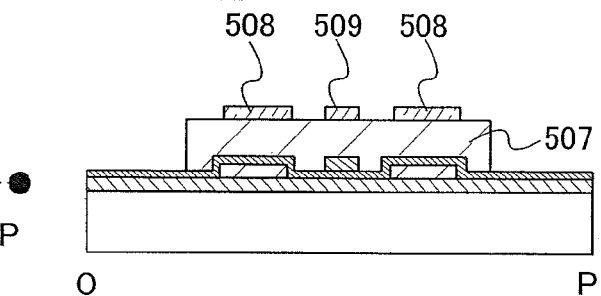
FIG. 16B1
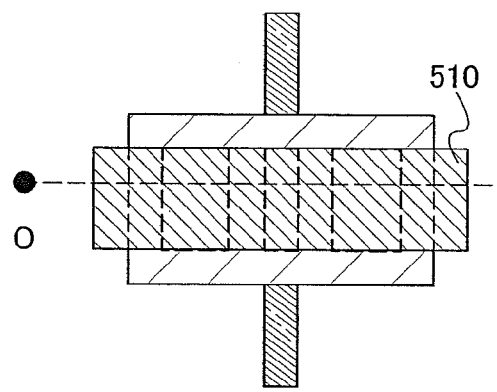
FIG. 16B2
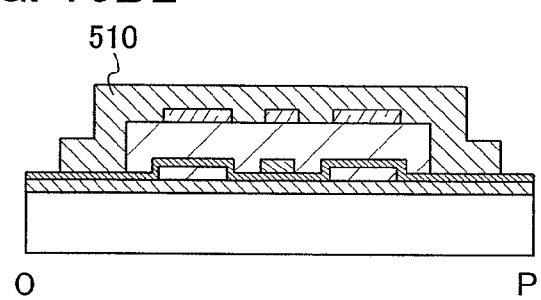
FIG. 16C1
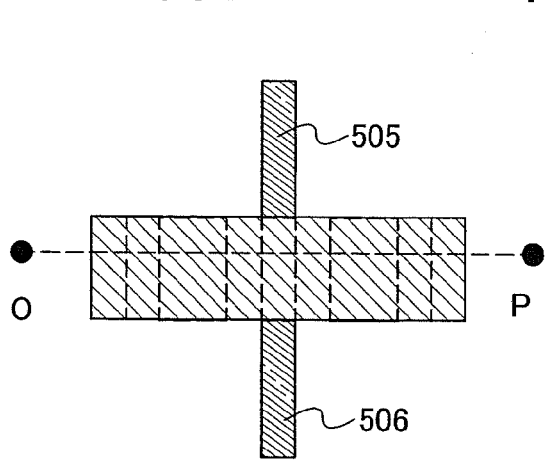
FIG. 16C2
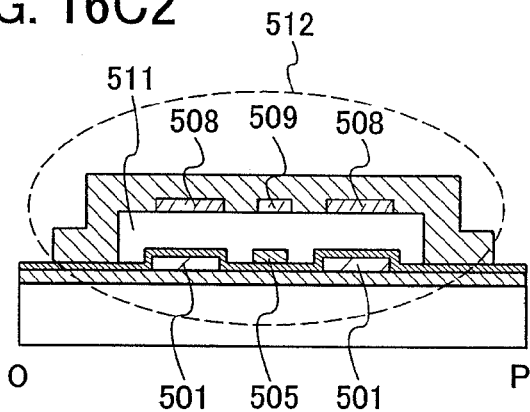

FIG. 17A1
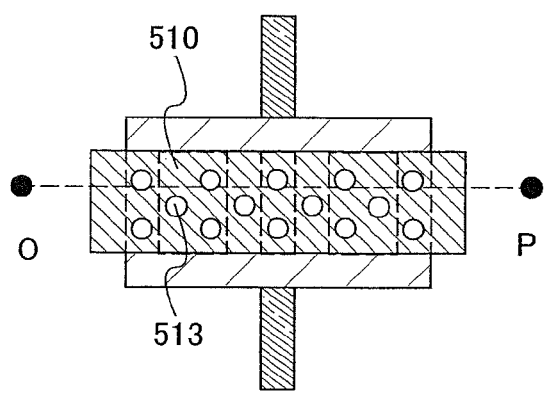
FIG. 17A2
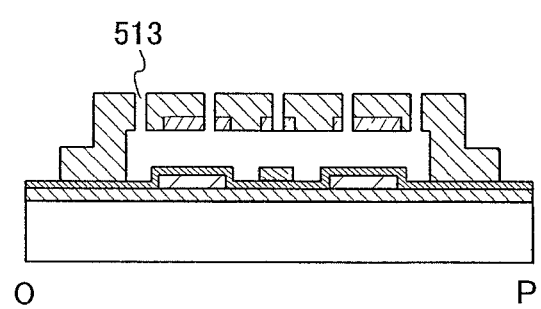
FIG. 17B1
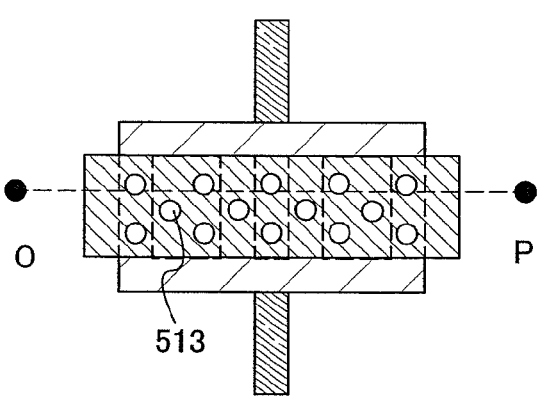
FIG. 17B2
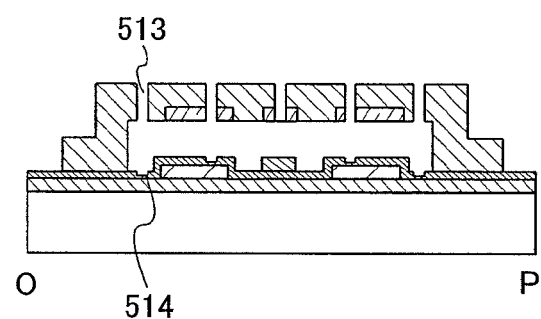

FIG. 18A1
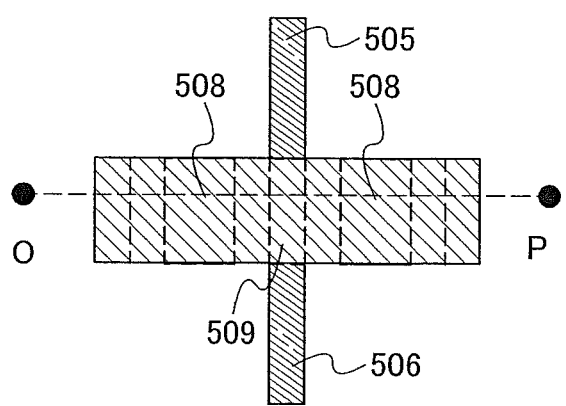
FIG. 18A2
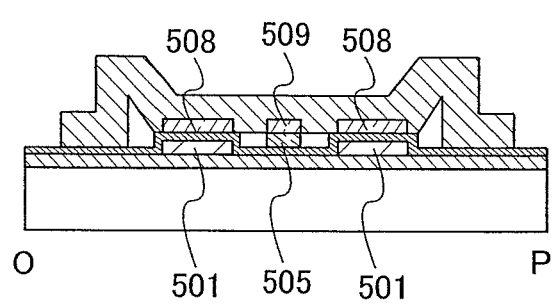

FIG. 19A1
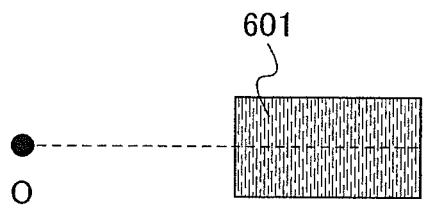
FIG. 19A2
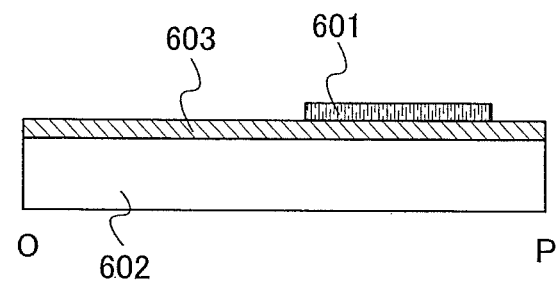
FIG. 19B1
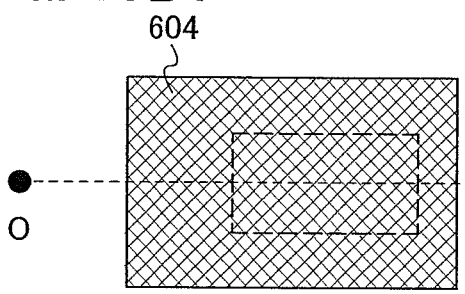
FIG. 19B2
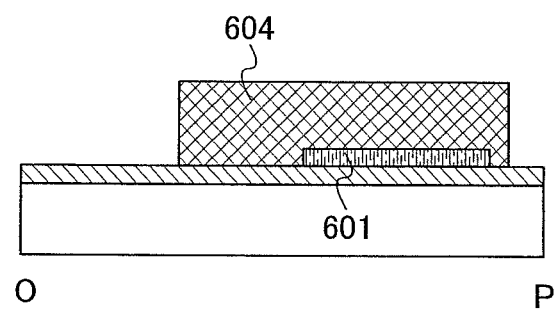
FIG. 19C1
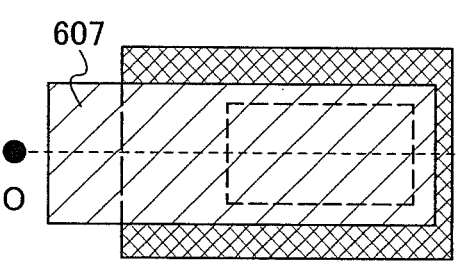
FIG. 19C2
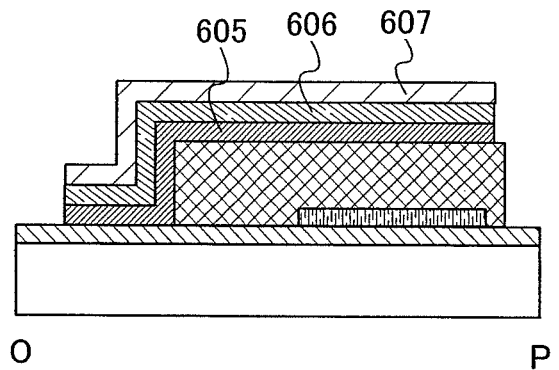
FIG. 19D1
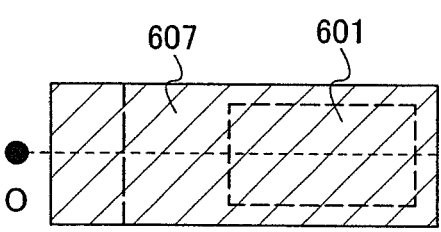
FIG. 19D2
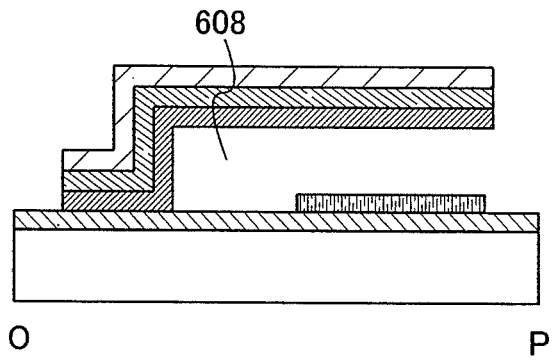

FIG. 20A1 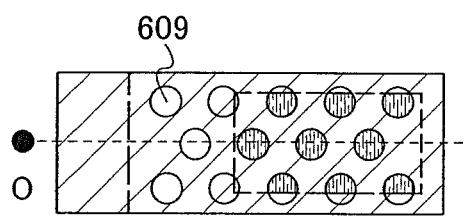
FIG. 20A2 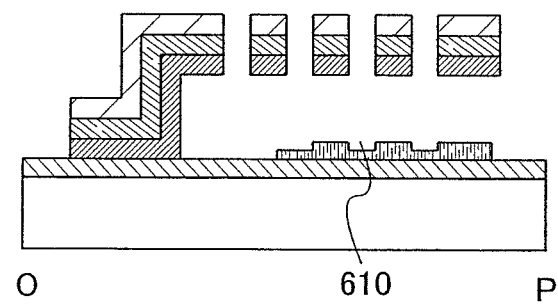
FIG. 20B1 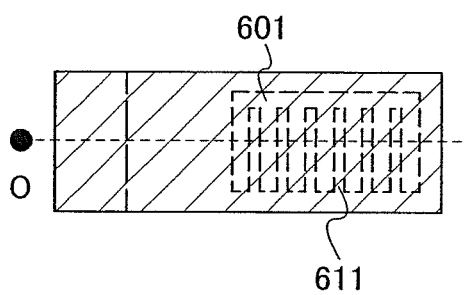
FIG. 20B2 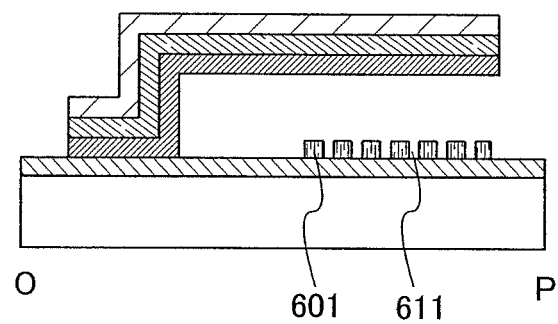
FIG. 20C1 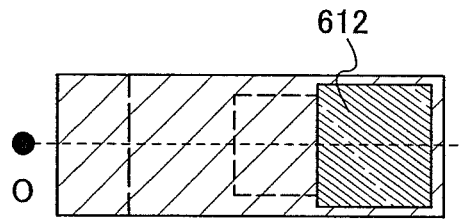
FIG. 20C2 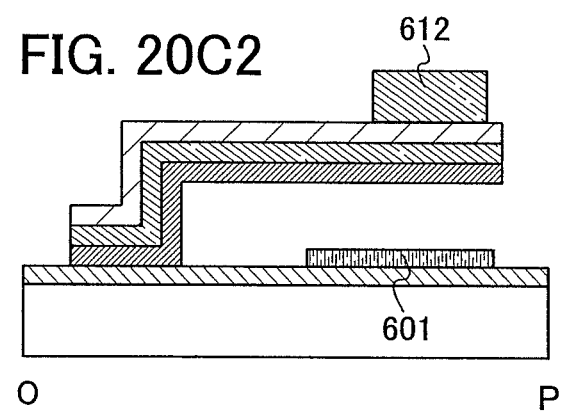

FIG. 21A1
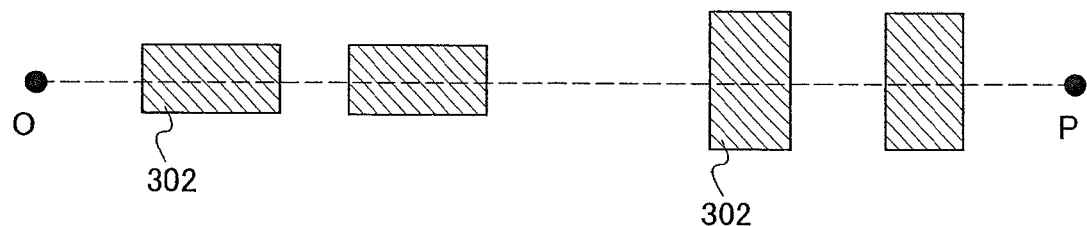
FIG. 21A2
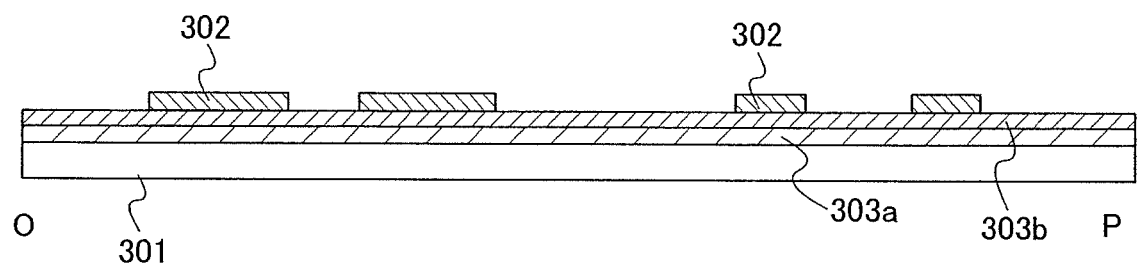
FIG. 21B1
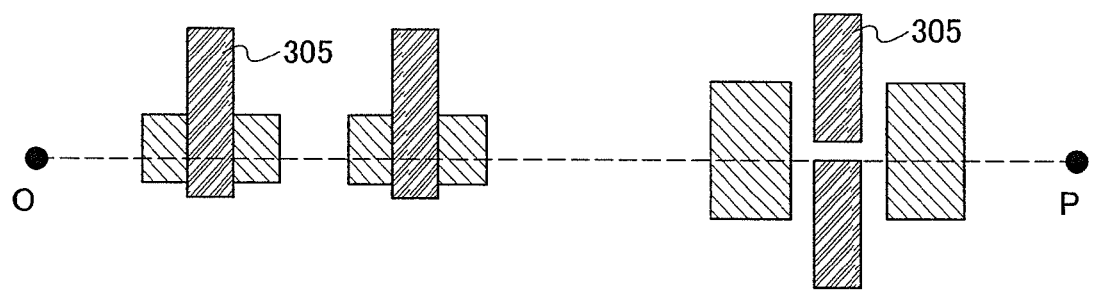
FIG. 21B2
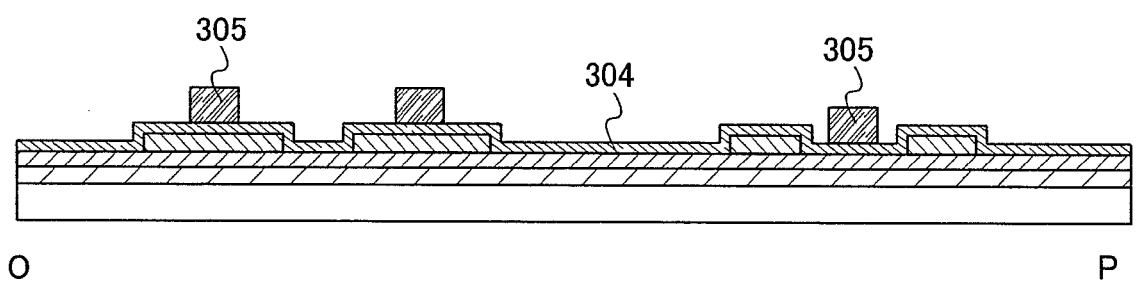

FIG. 22A1
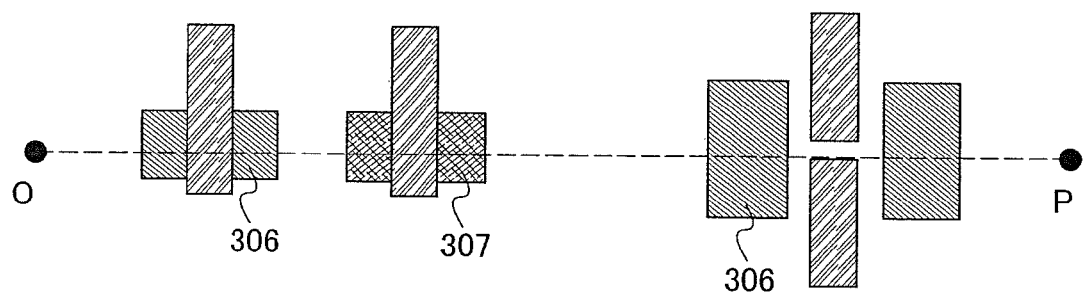
FIG. 22A2
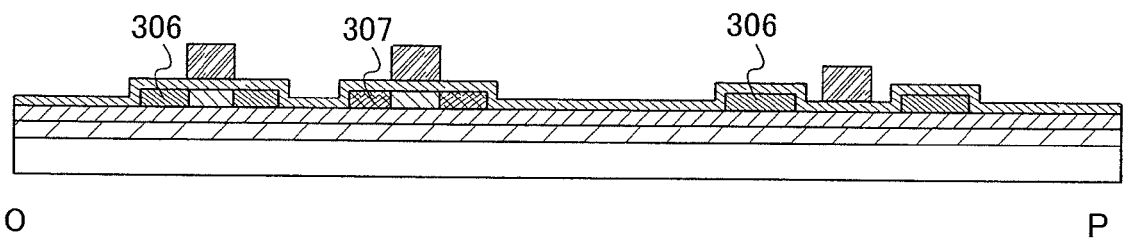
FIG. 22B1
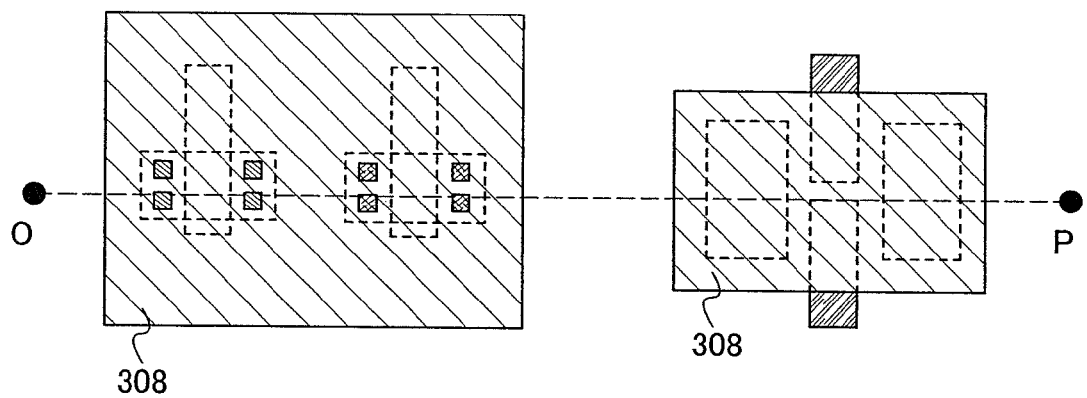
FIG. 22B2
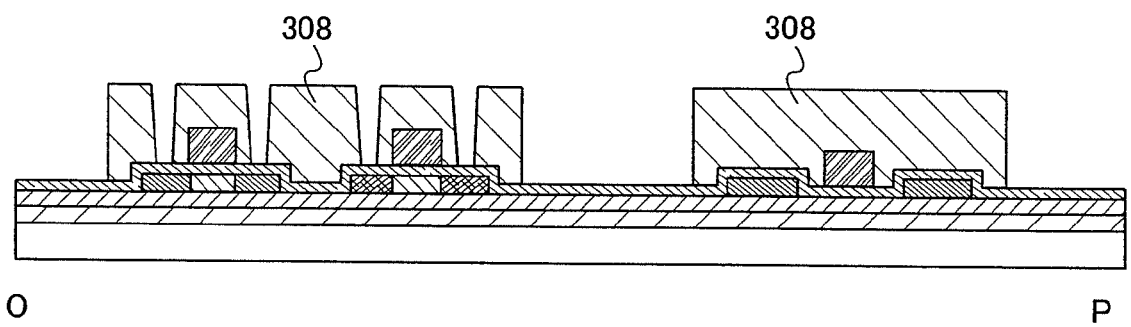

FIG. 23A1
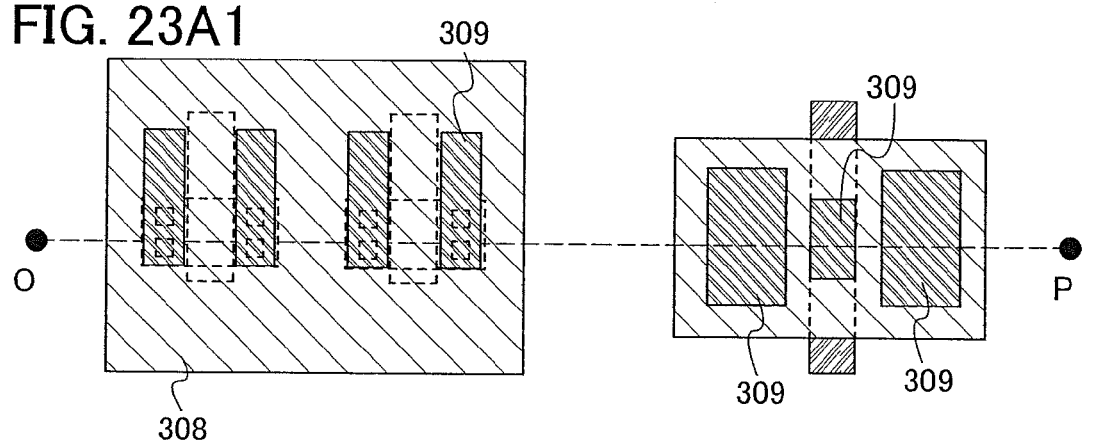
FIG. 23A2
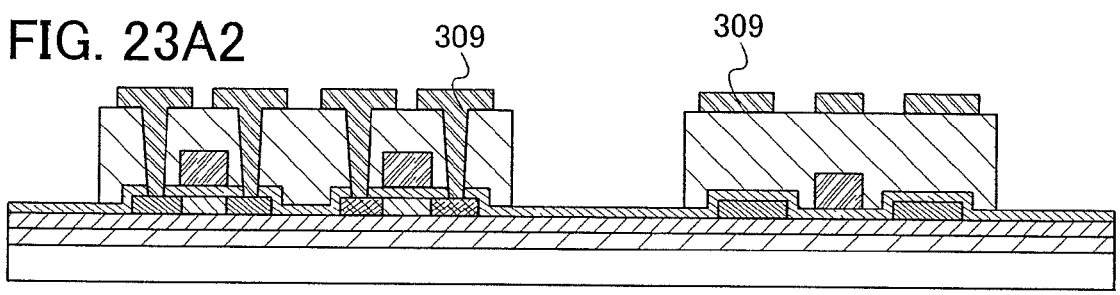
FIG. 23B1
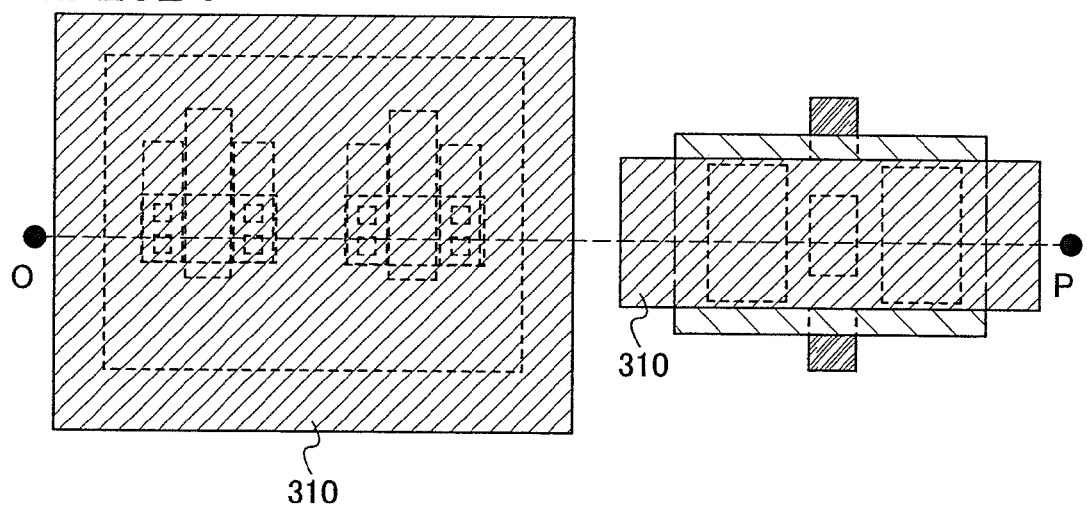
FIG. 23B2
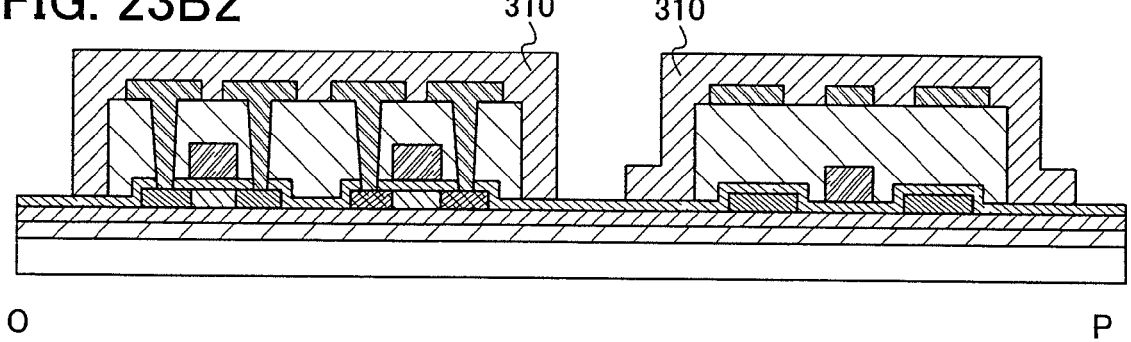

FIG. 24A1
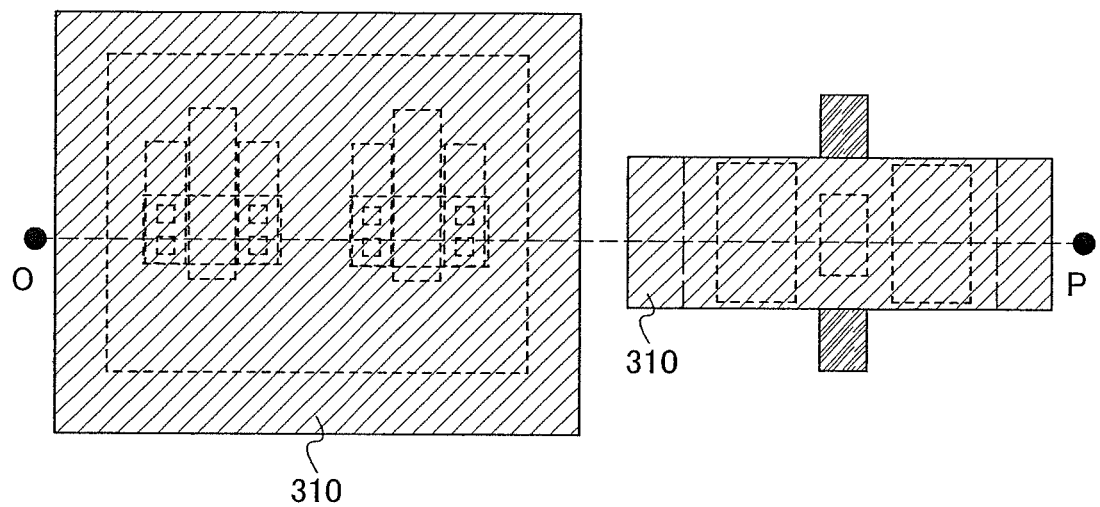
FIG. 24A2
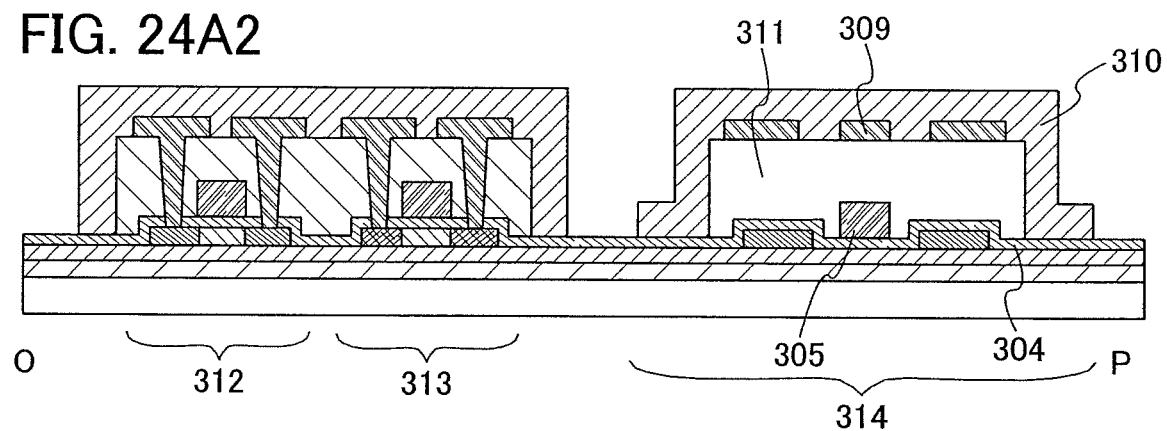

FIG. 25A1
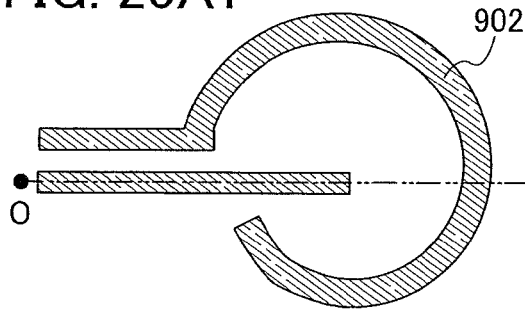
FIG. 25A2
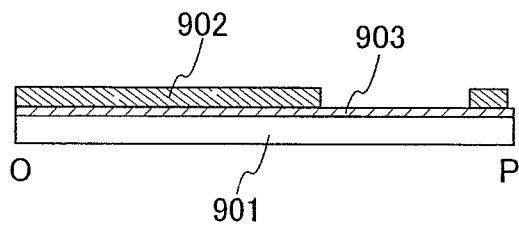
FIG. 25B1
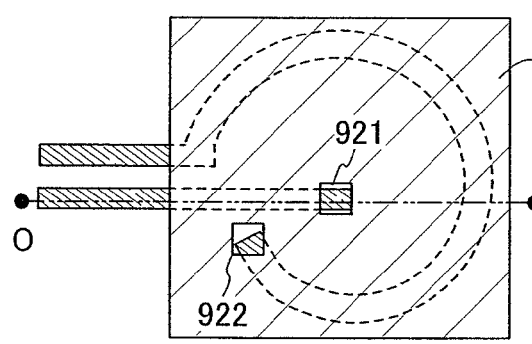
FIG. 25B2
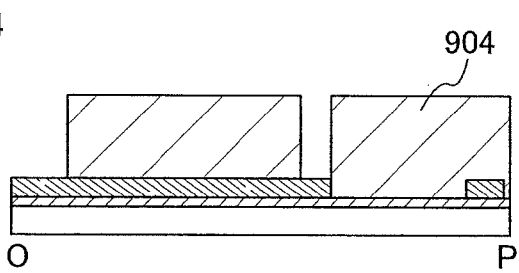
FIG. 25C1
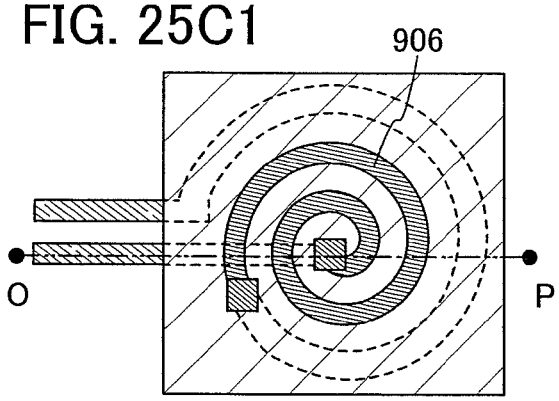
FIG. 25C2
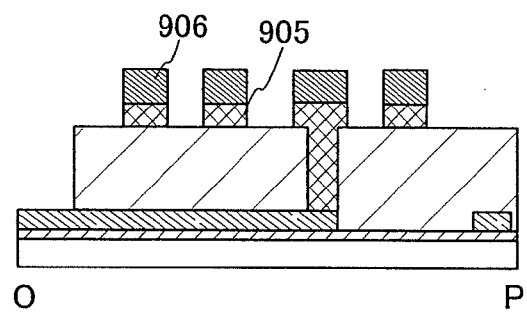
FIG. 25D1
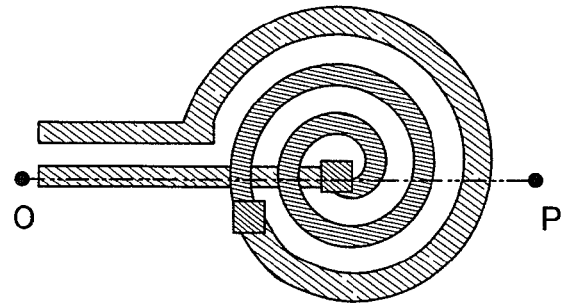
FIG. 25D2
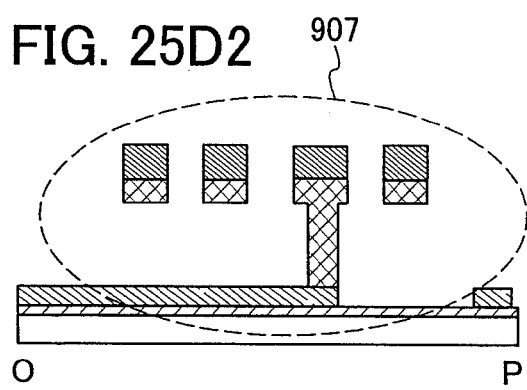

FIG. 26A1 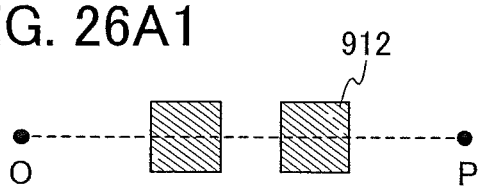
FIG. 26A2 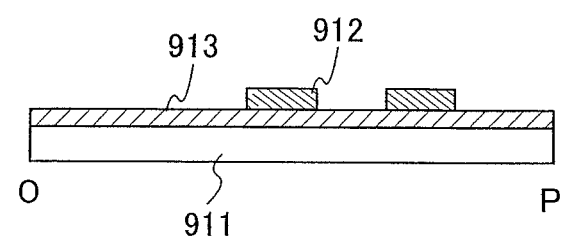
FIG. 26B1 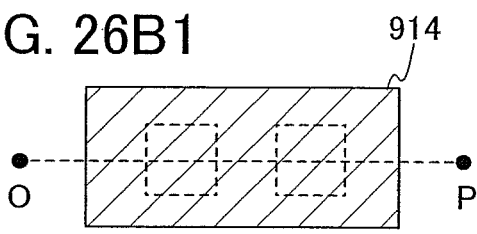
FIG. 26B2 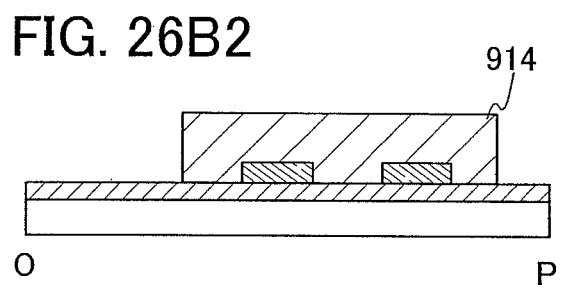
FIG. 26C1 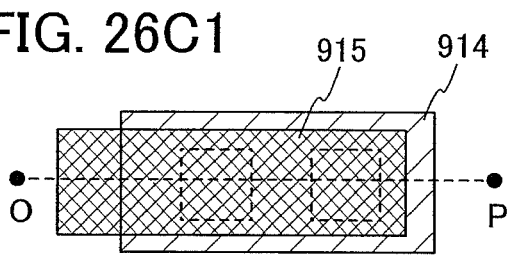
FIG. 26C2 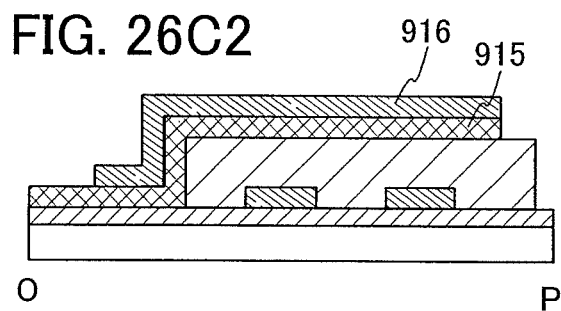
FIG. 26D1 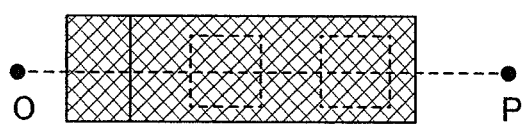
FIG. 26D2 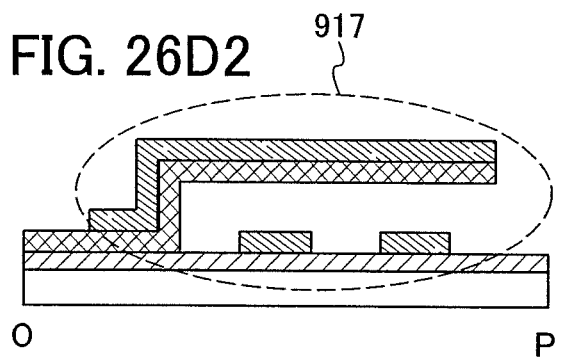

2704

SEMICONDUCTOR DEVICE AND MANUFACTURING METHOD THEREOF

CROSS-REFERENCE TO RELATED APPLICATIONS

This application is a continuation of U.S. application Ser. No. 11/552,369, filed Oct. 24, 2006, now allowed, which claims the benefit of a foreign priority application filed in Japan as Serial No. 2005-312034 on Oct. 26, 2005, both of which are incorporated by reference.

BACKGROUND OF THE INVENTION

1. Field of the Invention

The present invention relates to a semiconductor device having a microstructure such as a micromachine, and also relates to a manufacturing method thereof.

2. Description of the Related Art

Researches have been conducted on manufacturing minute machines by a process for manufacturing a semiconductor element and a method similar to that process. For example, a three-dimensional structural body having a space and a portion moving in the space, such as a gear or a bridge structure, is manufactured by processing a silicon wafer.

In recent years, researches have been advanced on manufacturing a micro electromechanical device having one function by manufacturing a structural body as aforementioned and a semiconductor element over one substrate or by attaching a structural body and a semiconductor element, which are manufactured separately, to each other. The electromechanical device is referred to as a MEMS (Micro Electro Mechanical System), a micromachine, or the like. At present, micromachines such as the following are manufactured: a pressure sensor or an acceleration sensor that detects movement of a portion thereof which moves in a space; a variable capacitor, an inductor, or a waveguide which uses a space as a favorable insulator other than having a portion moving in the space; and the like.

Micromachines are classified into two groups according to their manufacturing methods. One is called bulk micromachines which are obtained by manufacturing a three-dimensional structural body in such a way that a silicon wafer or an SOI substrate itself is processed by etching or polishing. The other is called surface micromachines which are obtained by manufacturing a three-dimensional structural body in such a way that a thin film is stacked over a substrate such as a silicon wafer and the thin film is processed by photolithography, which is a general process for manufacturing a semiconductor element.

Since a bulk micromachine is obtained by processing a substrate from various directions, the degree of freedom in manufacturing a three-dimensional structural body is so high that various structural bodies can be manufactured. However, many steps are different from those in a process for manufacturing a semiconductor element. Accordingly, in many cases, a semiconductor element and a structural body are separately manufactured and then they are attached to each other or they are packaged into one without being attached to each other.

Here, a basic method for manufacturing a structural body in a surface micromachine is described. First, as shown in FIG. 27A, a sacrifice layer 2701 is formed to form a space in a structural body. This sacrifice layer 2701 is to be removed later. Next, as shown in FIG. 27B, a structural layer 2702 is formed over the sacrifice layer. The structural layer has a three-dimensional shape because the structural layer is formed over the sacrifice layer. Then, a space 2703 is formed under the structural layer by etching away the sacrifice layer 2701 as shown in FIG. 27C; thus, a part of the structural layer over the space (here a portion above the sacrifice layer) can move.

Here, an example of a simple structural body having the structural layer 2702 and the space 2703 over a substrate is shown.

As well as being an important step in manufacturing a micromachine, sacrifice layer etching is a rate-controlling point having a number of problems. For example, sacrifice layer etching needs to progress in a lateral direction, i.e., a direction parallel to a substrate surface in order to remove a part of the sacrifice layer that overlaps with the structural layer, and thus, the sacrifice layer etching is conducted by isotropic etching. Moreover, since the sacrifice layer has thick thickness in order to form a space and is as long as several micrometers, it takes much time to etch the sacrifice layer. Further, the sacrifice layer etching leads to problems in that the sacrifice layer 2704 is left because a part thereof that overlaps with the structural layer 2702 cannot be removed completely as shown in FIG. 28A, and that the structural layer buckles as shown in FIG. 28B and attaches the substrate.

In such a surface micromachine, it is necessary that the sacrifice layer be formed in order to form a space and a structure portion that can move in the space, and that sacrifice layer etching be performed to remove the sacrifice layer. This sacrifice layer etching is a significant rate-controlling point in manufacturing a micromachine. This is because it takes much time to isotropically etch the sacrifice layer that basically has thick thickness and moreover because, in many cases, the movable portion and the substrate are attached to each other after the etching.

For example, in order to shorten the time for the sacrifice layer etching, a process in which a tunnel is provided in the sacrifice layer so that an etchant is easily introduced in the sacrifice layer at the sacrifice layer etching is considered (see Patent Document 1).

The attachment between a bottom surface of the movable portion and a surface of the substrate includes attachment caused when drying after the sacrifice layer etching and attachment caused as a secondary result of impact or static electricity after the drying. It is considered that the attachment when drying is caused by sublimation or supercritical drying and the secondary attachment is caused by formation of a low-energy film.

[Patent Document 1] Japanese Published Patent Application No. 2000-58866

According to the method described in Patent Document 1, the time required for the sacrifice layer etching can be shortened. However, since the sacrifice layer needs to be formed in two separate steps, the number of steps is increased overall. A countermeasure against the attachment caused when drying and the countermeasure disclosed in Patent Document 1 to prevent the secondary attachment both have problems in long-term reliability and require particular apparatuses and materials.

Although micromachines have functions that cannot be realized by semiconductor elements, micromachines have not yet been introduced into markets because cost cannot be reduced due to its complicated process. Thus, inexpensive and high-value-added micromachines are expected. As a specific example, manufacturing of a plurality of structural bodies with different functions over one substrate through the same process is expected.

SUMMARY OF THE INVENTION

It is an object of the present invention to manufacture a micromachine having a plurality of structural bodies with different functions and to shorten the time required for sacrifice layer etching in a process for manufacturing the micromachine. Moreover, according to the present invention, a structural layer is prevented from being attached to a substrate after the sacrifice layer etching. That is to say, it is an object of the present invention to provide an inexpensive and high-value-added micromachine by improving throughput and yield.

In order to solve the above problems, the sacrifice layer etching is conducted in multiple steps in the present invention. By dividing the sacrifice layer etching into multiple steps and applying an optimum etching method selected in accordance with a status, the sacrifice layer etching is conducted in a short period of time and with certainty. In specific, in the multiple etching steps, a part of the sacrifice layer that does not overlap with the structural layer is removed in an earlier etching step and a part of the sacrifice layer that is under the structural layer is removed in a later etching step.

In this specification, a layer which is to form a space of a structural body and which will be removed later is referred to as "a sacrifice layer" and a step of removing the layer which is to form the space of the structural body is referred to as "sacrifice layer etching". This sacrifice layer has roles of not only forming the space but also determining a shape of a portion moving in the space.

Specific methods of the present invention will be shown hereinafter.

According to one aspect of the present invention, a method for manufacturing a semiconductor device includes: forming a sacrifice layer by processing a first layer formed over an insulating surface; forming a structural layer by processing a second layer formed over the sacrifice layer; removing a part of the sacrifice layer that does not overlap with the structural layer by anisotropic etching; and removing a part of the sacrifice layer that overlaps with the structural layer by isotropic etching.

According to another aspect of the present invention, a method for manufacturing a semiconductor device includes: forming a sacrifice layer by processing a first layer formed over an insulating surface; forming a structural layer by processing a second layer formed over the sacrifice layer; removing a part of the sacrifice layer that does not overlap with the structural layer by anisotropic etching; removing the sacrifice layer by isotropic etching while leaving a central portion of a part of the sacrifice layer that overlaps with the structural layer; and removing the central portion of the sacrifice layer of the part thereof that overlaps with the structural layer by isotropic etching.

According to another aspect of the present invention, a method for manufacturing a semiconductor device includes: forming a layer having an insulating property over an insulating surface; forming a sacrifice layer by processing a first layer formed over the layer having an insulating property; forming a structural layer by processing a second layer formed over the sacrifice layer; forming a plurality of openings in the structural layer; removing a part of the sacrifice layer that does not overlap with the structural layer including a part thereof that is under the openings by anisotropic etching; and removing a part of the sacrifice layer that overlaps with the structural layer by isotropic etching. It is to be noted that, in some cases, a part of the layer having an insulating property that is under the sacrifice layer is removed when the sacrifice layer is anisotropically etched away.

According to another aspect of the present invention, a method for manufacturing a semiconductor device includes: forming a protection layer having an insulating property over an insulating surface; forming a first conductive layer by processing a first layer having a conductive property formed over the protection layer; forming a sacrifice layer by processing a second layer formed over the first conductive layer; forming a second conductive layer by processing a third layer having a conductive property formed over the sacrifice layer; forming a structural layer by processing a fourth layer having an insulating or conductive property formed over the second conductive layer; removing a part of the sacrifice layer that does not overlap with the structural layer by anisotropic etching; and removing a part of the sacrifice layer that overlaps with the structural layer by isotropic etching.

According to another aspect of the present invention, a method for manufacturing a semiconductor device includes: forming a first conductive layer by processing a first layer having a conductive property formed over an insulating surface; forming a second layer having an insulating property over the first conductive layer; forming a sacrifice layer by processing a third layer formed over the second layer; forming a structural layer by processing a layer having a conductive property and a layer having an insulating property stacked over the sacrifice layer; forming a plurality of openings in the structural layer; removing a part of the sacrifice layer that does not overlap with the structural layer including a part thereof that is under the openings by anisotropic etching; and removing a part of the sacrifice layer that overlaps with the structural layer by isotropic etching. It is to be noted that, in some cases, a part of the second layer that is under the sacrifice layer is removed when the sacrifice layer is anisotropically etched away.

In the present invention, isotropic etching is conducted by using a liquid etchant filled in a container in such a way that the liquid etchant is made to flow. For example, the etchant can be controlled so as to flow by agitating the etchant in the container, vibrating a substrate having an insulating surface or the container, or making the etchant flow in or out of the container.

In the present invention, when a gaseous etchant introduced in an apparatus is used in the isotropic etching, the pressure in the apparatus can be changed by introducing the etchant or another gas into the apparatus and exhausting the etchant or another gas from the apparatus.

According to another aspect of the present invention, a semiconductor device includes: a structural body including a layer having an insulating property provided with a depression and a structural layer provided over the layer having an insulating property with a space therebetween. The structural layer is provided with an opening over the depression at a position overlapping with the depression.

According to another aspect of the present invention, a semiconductor device includes a structural body. The structural body includes: a pair of first conductive layers; a layer having an insulating property which is formed to cover the first conductive layers and which is provided with a depression; a second conductive layer provided over the layer having an insulating property and between the pair of first conductive layers; and a third conductive layer and a structural layer both of which are provided over the layer having an insulating property with a space therebetween. The third conductive layer is provided so as to face the first conductive layer and the second conductive layer with a space therebetween. The structural layer is provided with an opening over the depression at a position overlapping with the depression.

According to another aspect of the present invention, a semiconductor device having a wireless communication function includes a wireless communication circuit and an information processing circuit. The information processing circuit has a semiconductor element and the wireless communication circuit has a passive element. The passive element has two conductive layers facing each other with a space therebetween, and the semiconductor element and the passive element are formed over one insulating surface.

According to another aspect of the present invention, a semiconductor device having a wireless communication function includes a wireless communication circuit, an information processing circuit, and a sensor. The information processing circuit has a semiconductor element and the wireless communication circuit has a passive element. The passive element has two conductive layers facing each other with a space therebetween. The sensor includes two conductive layers facing each other with a space therebetween, one of which constitutes a part of a structural layer moving in the space. The semiconductor element and the passive element are formed over one insulating surface.

In the present invention, the passive element can function as an inductor or a capacitor.

The present invention can provide a process by which a semiconductor element and a plurality of structural bodies with different functions and structures can be formed over one insulating substrate through the same process. Moreover, in the present invention, the time required for the sacrifice layer etching can be shortened without adding a complicated process.

Furthermore, in the present invention, a semiconductor element and a plurality of kinds of structural bodies can be formed integrally and a bottom surface of the structural layer can be prevented from being attached to a surface of the substrate without adding a complicated process. In other words, the present invention can provide an inexpensive and high-value-added micromachine by improving throughput and yield.

BRIEF DESCRIPTION OF DRAWINGS

In the accompanying drawings:
FIGS. 8A to 8C show sacrifice layer etching;
FIGS. 15A1 to 15C2 show a method for manufacturing a micromachine of the present invention;
FIGS. 16A1 to 16C2 show a method for manufacturing a micromachine of the present invention;
FIGS. 17A1 to 17B2 show a method for manufacturing a micromachine of the present invention;
FIGS. 18A1 and 18A2 show a method for manufacturing a micromachine of the present invention;
FIGS. 19A1 to 19D2 show a method for manufacturing a micromachine of the present invention;
FIGS. 20A1 to 20C2 show a method for manufacturing a micromachine of the present invention;
FIGS. 21A1 to 21B2 show a method for manufacturing a micromachine of the present invention;
FIGS. 22A1 to 22B2 show a method for manufacturing a micromachine of the present invention;
FIGS. 23A1 to 23B2 show a method for manufacturing a micromachine of the present invention;
FIGS. 24A1 and 24A2 show a method for manufacturing a micromachine of the present invention;
FIGS. 25A1 to 25D2 show a method for manufacturing a micromachine of the present invention;
FIGS. 26A1 to 26D2 show a method for manufacturing a micromachine of the present invention.

DETAILED DESCRIPTION OF THE INVENTION

Figure 1A:
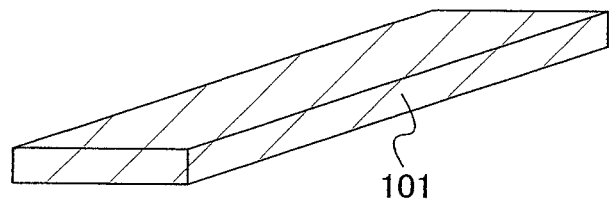
FIGS. 1A to 1D show a method for manufacturing a micromachine of the present invention.

Embodiment modes and embodiments of the present invention will be hereinafter described with reference to drawings. However, the present invention is not limited to the following description. It is easily understood by those skilled in the art that the mode and detail can be variously changed unless departing from the scope and spirit of the present invention. Therefore, the present invention will not be construed as being limited to the description of the embodiment modes and embodiments hereinafter shown. It is to be noted that the reference numeral indicating the same part may be used in common throughout the drawings in the description of the constitution of the present invention.

Embodiment Mode 1

This embodiment mode will describe a method for manufacturing a micromachine.

First, as shown in FIG. 1A, a sacrifice layer 101 is formed by processing a first layer formed over a substrate having an insulating surface. Here, the first layer may be formed to have a single-layer or multilayer structure. The shaping process of the sacrifice layer 101 can be performed by resist patterning by photolithography and a dry or wet etching method. The sacrifice layer 101 has a thickness of 0.8 to 15 µm.

As the substrate having an insulating surface, a glass substrate, a quartz substrate, a metal substrate, a flexible substrate such as a plastic substrate, or the like can be used. Moreover, a semiconductor substrate made of silicon or the like over which a layer having an insulating property (hereinafter referred to as an insulating layer) is formed can also be used.

The first layer may be formed directly on these insulating surfaces, or the first layer can also be formed over an insulating layer functioning as a protection film, a base layer, or the like. In addition, the first layer can be formed over a semiconductor element or the like which is formed over the insulating surface.

The sacrifice layer 101 can be formed by a sputtering method or a CVD method using a metal such as titanium (Ti), aluminum (Al), molybdenum (Mo), tungsten (W), or tantalum (Ta); an oxide of the metal; a nitride of the metal; a semiconductor material containing silicon or germanium; an oxide or nitride of the semiconductor material; phosphosilicate glass (PSG); or the like.

Figure 1B:
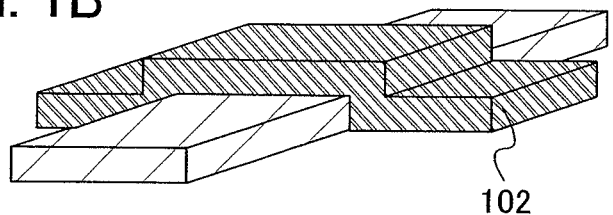

Subsequently, as shown in FIG. 1B, a structural layer 102 is formed by processing a second layer formed over the sacrifice layer 101. Similarly to the first layer, the second layer can also be formed to have a single-layer or multilayer structure. The shaping process of the structural layer 102 can be performed by resist patterning by photolithography and a dry or wet etching method.

It is acceptable as long as the structural layer 102 is formed using a material having resistance to an etchant used to etch the sacrifice layer 101. For example, the material can be selected from metals such as titanium (Ti), aluminum (Al), molybdenum (Mo), tungsten (W), and tantalum (Ta); an oxide of the metal; a nitride of the metal; a semiconductor material containing silicon or germanium; and an oxide or nitride of the semiconductor material.

Here, a specific example of a combination of the sacrifice layer 101, the structural layer 102, and the etchant used for etching the sacrifice layer 101 is shown. For example, if fluorinated acid is used as the etchant during the sacrifice layer etching, the sacrifice layer 101 can be formed with phosphosilicate glass (PSG) or silicon oxide and the structural layer 102 can be formed with silicon having a polycrystalline structure. In the case of using an ammonia peroxide mixture as the etchant, the sacrifice layer 101 can be formed with tungsten (W) and the structural layer 102 can be formed with silicon oxide. The ammonia peroxide mixture is a liquid in which ammonia, hydrogen peroxide water, and pure water are mixed, and which can be obtained, for example, by mixing 28 wt % of ammonia, 31 wt % of hydrogen peroxide water, and pure water at a ratio of 3:5:2.

Moreover, silicon can be dissolved in a mixed solution of HF and $HNO_3$ (preferably with further addition of $CH_3COOH$), a KOH solution, an NaOH solution, an EPW solution (a mixed solution of ethylenediaminepyrocatechol and water), an EDP (ethylenediaminepyrocatechol) solution, a TMAH (tetramethylammonium hydride) solution, a hydrazine solution, or the like. Moreover, silicon can be removed by an $XeF_2$ gas, a mixed gas of $SF_6$ and $C_4F_8$, an $SF_6$ gas, or the like. Since selectivity between silicon and silicon oxide can be obtained by using these etchants, the sacrifice layer 101 can be formed with silicon and the structural layer 102 can be formed with silicon oxide. On the contrary, if the sacrifice layer 101 is formed with silicon oxide and the structural layer 102 is formed with silicon, the etchant may be a mixed solution of HF and $NH_4F$, an $NH_4HF_2$ solution, a buffered fluorinated acid solution, or the like; or a mixed gas of HF and $NH_4F$, a mixed gas of $SF_6$, $C_4F_8$, and $H_2$, or the like.

Since KOH, EPW, EDP, TMAH, and hydrazine cause anisotropy in etching rate depending on impurity concentration or plane orientation of a silicon crystal having a polycrystalline structure, the sacrifice layer 101 and the structural layer 102 can be formed with silicon having different plane orientation or different impurity concentration.

Figure 1C:
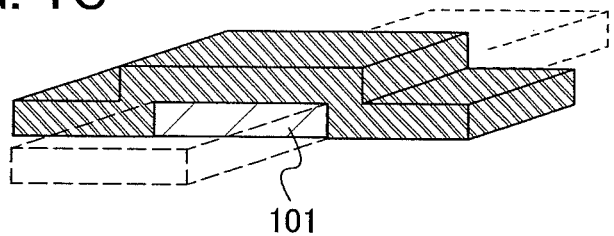

Next, a part of the sacrifice layer that does not overlap with the structural layer 102 is removed first as shown in FIG. 1C. In this specification, if the sacrifice layer etching is carried out in multiple steps, the steps are given the order: first sacrifice layer etching, second sacrifice layer etching, third sacrifice layer etching, and so on. In other words, as shown in FIG. 1C, a part of the sacrifice layer 101 that does not overlap with the structural layer 102 is removed by first sacrifice layer etching. As the first sacrifice layer etching, anisotropic etching can be applied to etch away the part of the sacrifice layer 101 that does not overlap with the structural layer 102. Specifically, an anisotropic wet or dry etching method using the aforementioned etchant can be used. The first sacrifice layer etching is desirably anisotropic dry etching because anisotropic dry etching can be carried out in a much shorter period of time than wet etching.

Figure 1D:
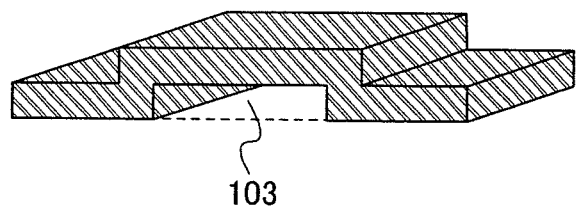

Next, another part of the sacrifice layer 101 that overlaps with the structural layer 102 is removed by second sacrifice layer etching as shown in FIG. 1D, thereby forming a space 103. As the second sacrifice layer etching, isotropic etching in which the etchant also diffuses in a lateral direction is applied to remove a part of the sacrifice layer 101 that is under the structural layer 102. Specifically, an isotropic wet or dry etching method using the aforementioned etchant can be applied. The isotropic etching is, for example, a method using plasma of an etching gas under an atmospheric pressure.

Figure 2A:
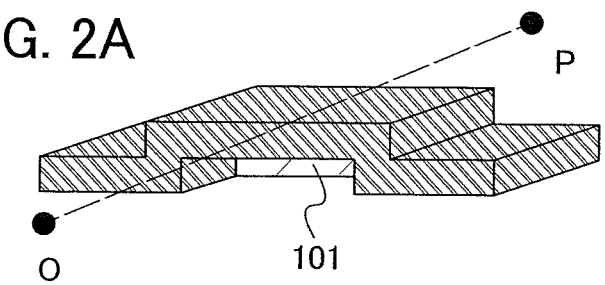
FIGS. 2A to 2C show a method for manufacturing a micromachine of the present invention.
Figure 2B:
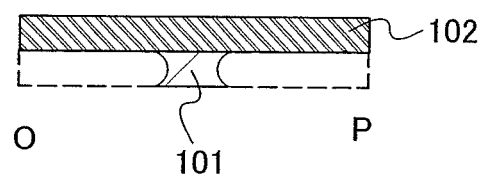

Moreover, the second sacrifice layer etching can be carried out by isotropic wet etching while partially leaving the part of the sacrifice layer 101 that is under the structural layer 102. FIG. 2A is a perspective view in the case where the sacrifice layer 101 is partially left by the second sacrifice layer etching, and FIG. 2B is a cross-sectional view along a line O—P. Since the sacrifice layer etching progresses from a portion where the sacrifice layer 101 is in contact with the etchant toward the sacrifice layer under the structural layer 102, a small amount of the sacrifice layer 101 can be left in a central portion under the structural layer 102.

Figure 2C:
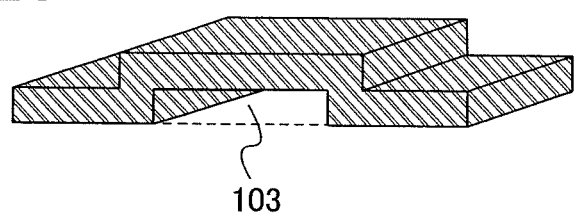

If the sacrifice layer 101 is partially left in this manner, the space 103 can be formed by removing the remaining part of the sacrifice layer 101 under the structural layer 102 by third sacrifice layer etching as shown in FIG. 2C. At this time, isotropic wet or dry etching can be applied as the third sacrifice layer etching.

Methods of the first sacrifice layer etching, the second sacrifice layer etching, and the third sacrifice layer etching as aforementioned can be selected based on a combination of the structural layer, the sacrifice layer, and the etchant for etching the sacrifice layer.

The structural body shown in FIGS. 1A to 2C has a beam structure with spaces over and under the structural layer 102, and the spaces are formed by forming the sacrifice layer 101 and the structural layer 102 and then conducting the sacrifice layer etching in at least two steps in this example. However, in the present invention, the shape of the structural body and the manufacturing method of the sacrifice layer 101 and the structural layer 102 are not limited to those described above. For example, the structural layer 102 of the structural body can have a cantilever shape, a comb shape, a gear wheel shape, or the like. Moreover, the sacrifice layer and the structural layer can be manufactured by using a silicon wafer. For example, by implanting an impurity into a silicon wafer, a sacrifice layer including silicon and a structural layer including silicon having the impurity may be formed separately.

Thus, in a method for manufacturing a micromachine of the present invention, the sacrifice layer is removed in multiple steps. The first sacrifice layer etching can be carried out in a short period of time since a part of the sacrifice layer to be removed does not overlap with the structural layer. This is because an area where the sacrifice layer is in contact with the etchant is so large that the etchant easily diffuses, and moreover because anisotropic etching with high etching rate can be applied due to the fact that the sacrifice layer does not overlap with the structural layer.

Thus, when the second sacrifice layer etching is conducted after decreasing the sacrifice layer by the first sacrifice layer etching, the second sacrifice layer etching can be conducted in a shorter period of time. Further, it is possible to avoid a problem that the sacrifice layer is not etched completely.

When wet etching is applied as the second sacrifice layer etching to entirely remove the part of the sacrifice layer 101 that is under the structural layer 102, the structural layer 102 may buckle because its structure cannot be maintained due to surface tension of a liquid existing under the structural layer 102, and there is a case where the structural layer 102 is attached to the substrate or an adjacent layer. If the part of the sacrifice layer 101 that is under the structural layer 102 is not entirely removed but is partially left by the second sacrifice layer etching, the part of the sacrifice layer 101 that is left can be used as a supporter that supports the structural layer 102 (see FIGS. 2A and 2B). In specific, the sacrifice layer 101 is removed while leaving a central portion of the sacrifice layer 101 that overlaps with the structural layer 102 and the central portion is used as the supporter. It is to be noted that the central portion does not indicate a center in a strict sense but indicates a shape of the sacrifice layer 101 when the second sacrifice layer etching is stopped in a state that the sacrifice layer 101 functions as the supporter. Then, the central portion of the sacrifice layer 101 that functions as the supporter can be removed by the third sacrifice layer etching. Therefore, the third sacrifice layer etching is desirably isotropic dry etching. Alternatively, wet etching using an etchant with surface tension low enough not to cause the attachment can be used.

In accordance with the present invention, a process that can form a semiconductor element and a plurality of structural bodies with different functions and structures over one insulating substrate through the same process can be provided without adding a complicated process. Moreover, the present invention can prevent the bottom surface of a structural layer from being attached to a surface of the substrate.

Embodiment Mode 2

A micromachine of the present invention has an electric circuit portion formed by a structural body and a semiconductor element. A mode of having an electric circuit portion will be described below.

Figure 3A:
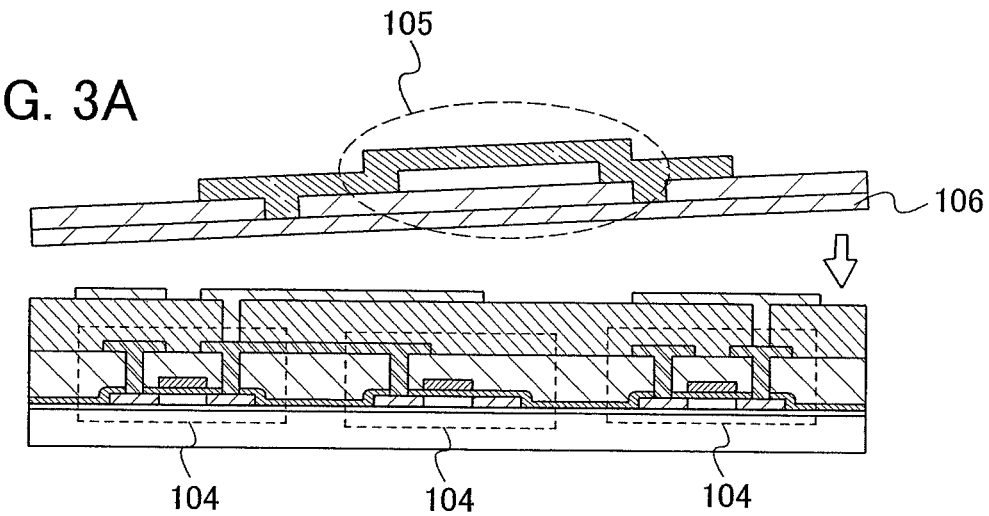
FIGS. 3A to 3C show a method for manufacturing a micromachine of the present invention.

As shown in FIG. 3A, a semiconductor element 104 and a structural body 105 can be formed over different substrates and the substrates can be attached to each other by using an adhesive 106 or the like.

Figure 3B:
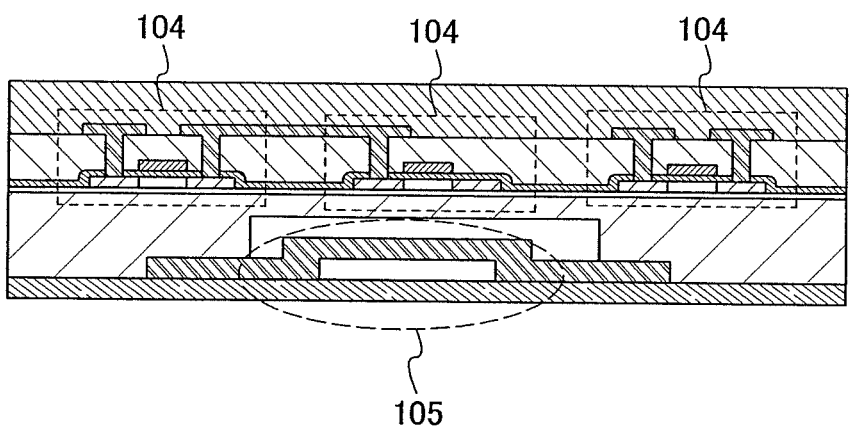
Figure 3C:
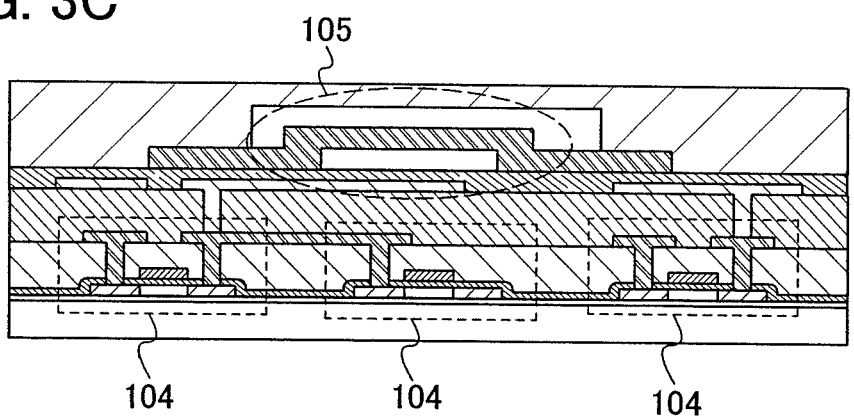

Moreover, as shown in FIG. 3B, the semiconductor element 104 can be formed over a sealed substrate in which the structural body 105 has been formed. Furthermore, as shown in FIG. 3C, after forming the semiconductor element 104, the structural body 105 can be formed as a layer over the semiconductor element 104. In addition, the structural body 105 and the semiconductor element 104 can be formed in the same layer by the same process.

In a micromachine formed in this way by the present invention, throughput and yield can be improved. As a result, an inexpensive and high-value-added micromachine can be provided.

Embodiment Mode 3

Differently from the aforementioned embodiment modes, this embodiment mode will describe a method for manufacturing a structural body provided with an opening (hereinafter also referred to as a hole).

Figure 4A:
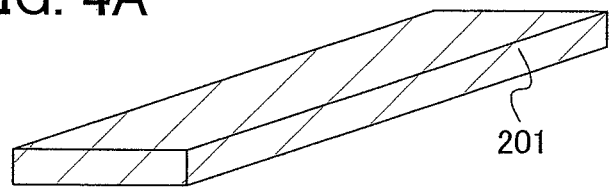
FIGS. 4A to 4D show a method for manufacturing a micromachine of the present invention.

First, as shown in FIG. 4A, a sacrifice layer 201 is formed by processing a first layer formed over an insulating substrate. The first layer can be formed by a single layer or stacked layers in a similar way to the above embodiment modes, and the shaping process of the first layer can be performed by resist patterning by photolithography and a dry or wet etching method.

Figure 4B:
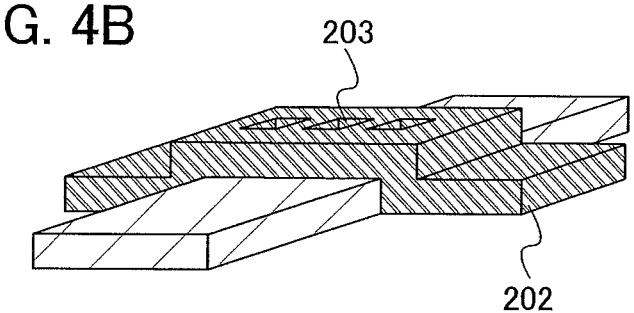
Figure 4C:
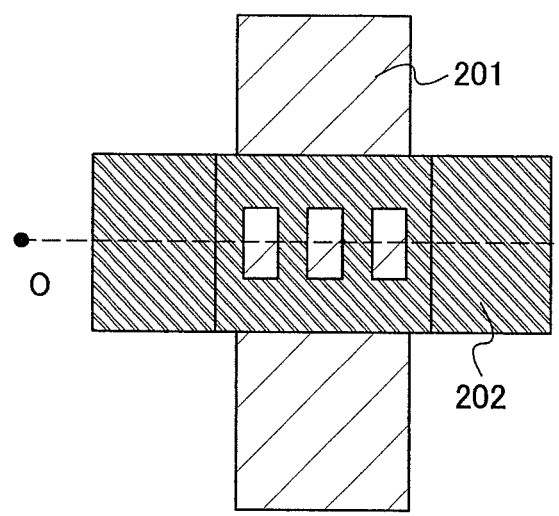
Figure 4D:
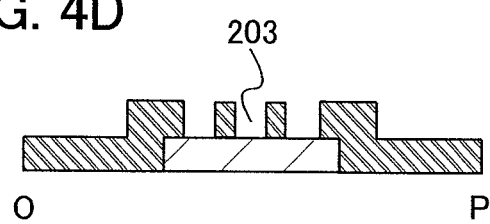

Subsequently, as shown in FIG. 4B, a structural layer 202 is formed by processing a second layer formed over the sacrifice layer 201. The second layer can be formed and processed in a similar manner to the first layer. Here, the structural layer 202 is provided with holes 203. The number of holes 203 may be one or more. If a plurality of holes are provided, the holes 203 may have different diameters from each other. FIG. 4C is a top view of the sacrifice layer 201 and the structural layer 202 provided with the holes 203, and FIG. 4D is a cross-sectional view along a line O—P of FIG. 4C.

Figure 5A:
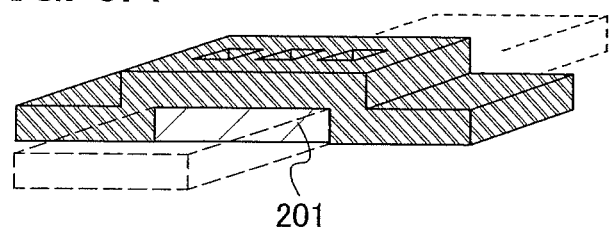
FIGS. 5A to 5D show a method for manufacturing a micromachine of the present invention.
Figure 5B:
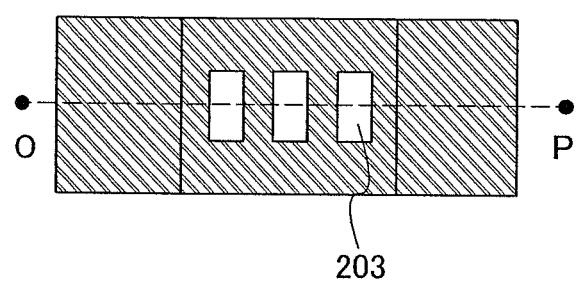
Figure 5C:
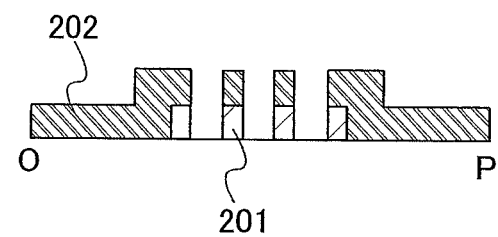

Next, a part of the sacrifice layer 201 that does not overlap with the structural layer 202 is removed by first sacrifice layer etching as shown in FIG. 5A. Similarly to the above embodiment mode, the first sacrifice layer etching may be anisotropic etching. FIG. 5B is a top view of the sacrifice layer 201 and the structural layer 202 after the first sacrifice layer etching, and FIG. 5C is a cross-sectional view along a line O—P of FIG. 5B. As shown in FIGS. 5B and 5C, a part of the sacrifice layer 201 that does not overlap with the structural layer 202 is also removed in the holes 203.

Figure 5D:
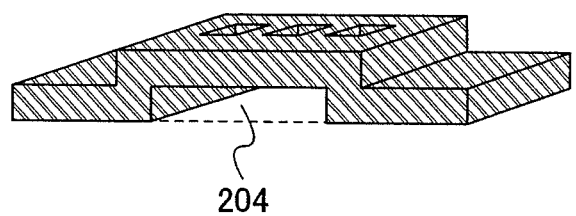

Subsequently, as shown in FIG. 5D, a part of the sacrifice layer 201 that overlaps with the structural layer 202 is removed by second sacrifice layer etching. Similarly to the above embodiment mode, the second sacrifice layer etching can be isotropic etching. By the second sacrifice layer etching, a space 204 of the structural body is formed.

As aforementioned, the sacrifice layer etching can be conducted in a shorter period of time than before by conducting the sacrifice layer etching in multiple steps. In addition, when the holes 203 are opened in the structural layer 202 as shown in this embodiment mode, the first sacrifice layer etching can remove a larger amount of the sacrifice layer 201 and the second sacrifice layer etching can remove a smaller amount of the sacrifice layer 201; therefore, the overall time required for the sacrifice layer etching can be shortened.

Figure 6A:
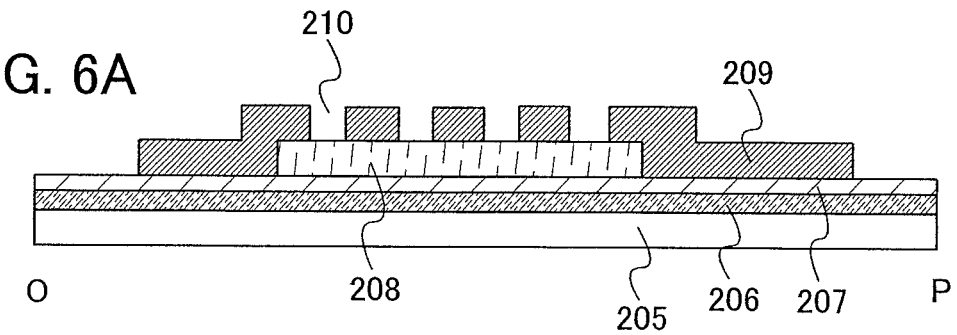
FIGS. 6A to 6D show a method for manufacturing a micromachine of the present invention.

As shown in FIG. 6A, a base layer is formed over a substrate 205, and a sacrifice layer 208 and a structural layer 209 having holes 210 are formed over the base layer. Since the base layer has a multilayer structure in FIG. 6A, a first base layer 206 and a second base layer 207 are stacked in order.

Figure 6B:
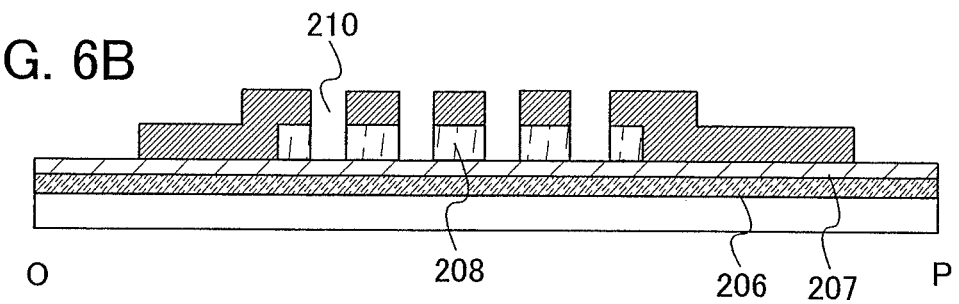

Subsequently, as shown in FIG. 6B, a part of the sacrifice layer 208 that does not overlap with the structural layer 209 is removed by first sacrifice layer etching. Thus, a part of the sacrifice layer 208 that is right under each hole 210 is etched away.

Figure 6C:
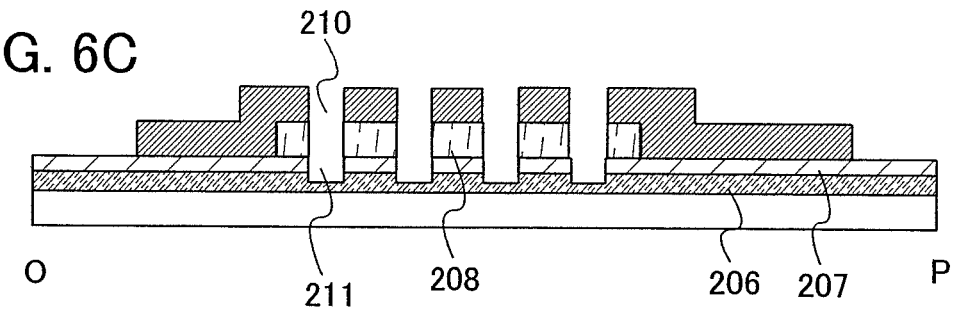

At this time, as shown in FIG. 6C, even the base layer under the holes 210 may be etched depending on the etching time and selectivity. This is the reason why the base layer has the multilayer structure of the first base layer 206 and the second base layer 207 in FIGS. 6A to 6D. The first base layer 206 in the holes 210 is etched away and the second base layer 207 in the holes 210 is partially etched away, and depressions 211 are formed as a result. Similarly to the above example, the first sacrifice layer etching and etching of the base layer can be anisotropic etching.

Figure 6D:
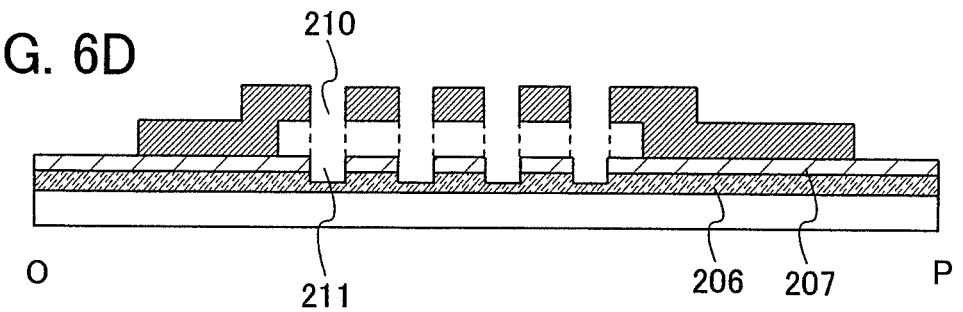

Then, as shown in FIG. 6D, a part of the sacrifice layer 208 that is under the structural layer 209 is removed by the second sacrifice layer etching. Similarly to the above example, the second sacrifice layer etching can be isotropic etching.

When the depressions 211 are formed by etching the base layers after the first sacrifice layer etching in this way, a bottom surface of the structural layer 209 which sandwiches the space with the second base layer 207 can be made rough. When the surface is rough, the etchant can be removed rapidly by surface tension and the buckling of the structural layer 209 due to drying or the like can be prevented.

The buckling caused when a force supporting the movable portion is weaker than the attaching force between the bottom surface of the movable portion and the surface facing the bottom surface corresponds to the buckling caused when drying. The attaching force between the bottom surface of the movable portion and the surface facing the bottom surface is generated by an existence of a liquid such as the etchant between them, and is proportional to the area where the liquid is in contact with the solid and the surface tension of the liquid.

If the diameter of the hole 210 provided in the structural layer 209 is smaller than the distance between the bottom surface of the movable portion and the surface facing the bottom surface (i.e., the thickness of the sacrifice layer), the facing surface can be made to be a lyophobic surface by an etching step. As a result, the attaching force between the facing surface and the liquid becomes small and the buckling can be prevented.

If the diameter of the hole 210 provided in the structural layer 209 is equal to or larger than the thickness of the sacrifice layer 208, a droplet falls in the depression 211 provided under the structural layer 209. Therefore, an area where the bottom surface of the movable portion is in contact with the liquid becomes small and the liquid is more easily separated from the bottom surface of the movable portion; thus, the buckling can be prevented.

When the bottom surface of the structural layer 209 becomes rough, the area where the bottom surface of the movable portion can be in contact with the surface facing the bottom surface becomes small and the buckling can be prevented. This is because the surface energy decreases by reducing the contact area.

In this way, the buckling, i.e., the attachment when drying and the secondary attachment, can be suppressed by forming the depression 211 on the bottom surface of the structural layer 209, specifically in the base layer, through the hole provided in the structural layer 209 to make the surface facing the movable portion rough.

Figure 7A:
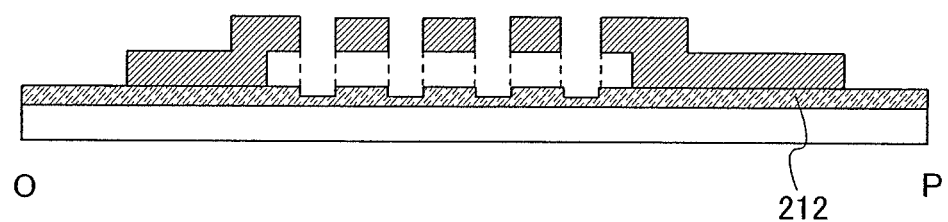
FIGS. 7A and 7B show a method for manufacturing a micromachine of the present invention.

Thus, since the bottom surface of the structural layer 209 only needs to be made rough, the base layer 212 can be formed in a single layer as shown in FIG. 7A.

In addition, the procedure may be: (1) forming the depression after the first sacrifice layer etching, (2) subjecting the surface of the depression to a lyophilic process, and (3) conducting the second sacrifice layer etching.

Figure 7B:
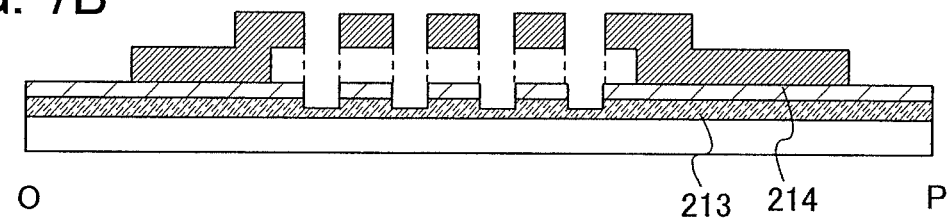

Further, as shown in FIG. 7B, when the first base layer 213 is formed with a lyophilic material and the second base layer 214 is formed with a lyophobic material and a depression is formed by etching until a part of the first base layer 213 is exposed in the aforementioned manner, liquid causing the attachment can easily enter the hole.

In this embodiment mode, the following procedure is also possible: forming the sacrifice layer 201 and the structural layer 202 provided with the holes 203; removing the part of the sacrifice layer 201 that does not overlap with the structural layer 202 by the first sacrifice layer etching; removing the part of the sacrifice layer 201 that overlaps with the structural layer 202 by the second sacrifice layer etching while partially leaving the sacrifice layer 201; and removing the part of the sacrifice layer 201 left by the second sacrifice layer etching by the third sacrifice layer etching. The part left by the second sacrifice layer etching can prevent the structural layer 202 from buckling during the manufacturing.

When the structural layer is provided with the holes and the sacrifice layer etching is conducted in multiple steps as shown in this embodiment mode, the time required for etching the sacrifice layer can be shortened without adding a complicated process and without using particular apparatus and material, and moreover, the structural layer can be prevented from buckling.

This embodiment mode can be freely combined with any of the above embodiment modes.

Embodiment Mode 4

Figure 28A:
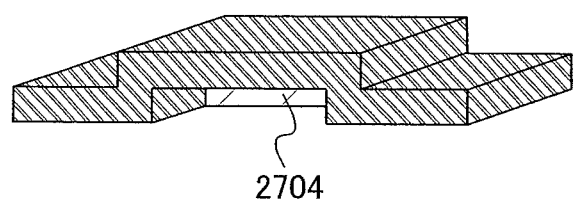
FIGS. 28A and 28B show a method for manufacturing a micromachine of the present invention.
Figure 28B:
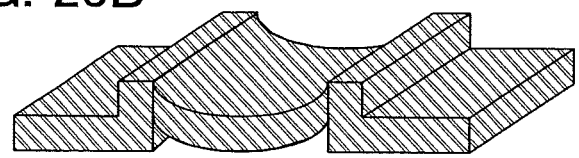

This embodiment mode will describe a method for manufacturing a micromachine with reference to FIGS. 28A and 28B which show a conventional method, and specifically describe a solution by a method of the present invention and points thereof that are different from those in the above embodiment modes.

When sacrifice layer etching is conducted by a conventional method, a problem may occur in that a sacrifice layer remains without being completely removed as shown in FIG. 28A. This is because of the following: (1) the sacrifice layer 2701 cannot be removed completely due to the large amount of the sacrifice layer material, or (2) some parts of the sacrifice layer 2701 are removed while other parts cannot be removed since the sacrifice layer etching takes a long time and causes variation in etching rate within the substrate surface. However, even if the sacrifice layer etching is conducted for a long enough time, in some cases, the sacrifice layer 2704 is partially left as shown in FIG. 28A and cannot be removed completely.

A phenomenon in which the sacrifice layer is left will be described in detail with reference to FIGS. 8A to 10B. For example, a sacrifice layer 401 and a structural layer 402 are formed as shown in the top view of FIG. 8A. Most part of the sacrifice layer 401 is covered with the structural layer 402 and the structural layer 402 has a long-tunnel structure.

Figure 10A:
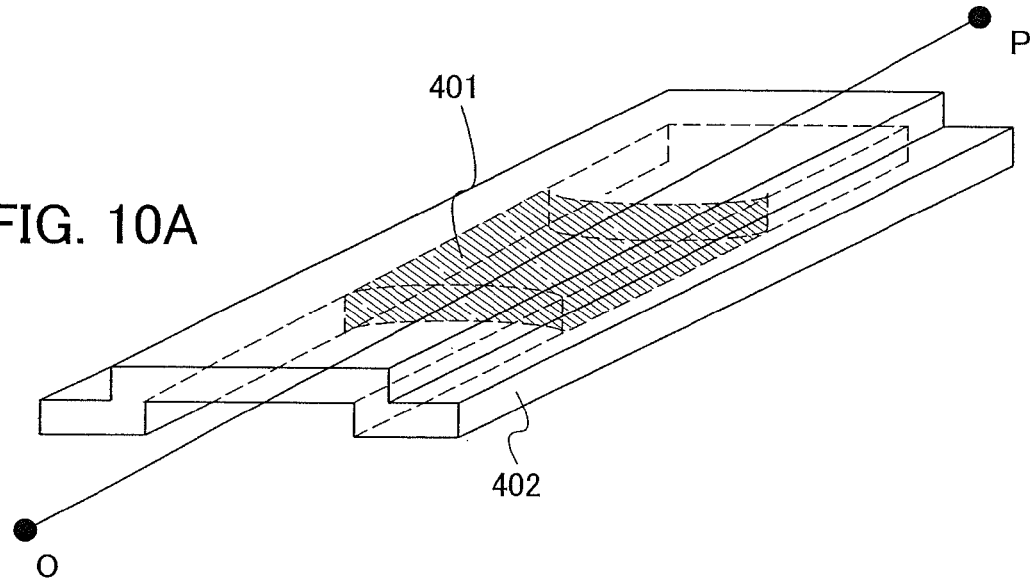
FIGS. 10A and 10B show sacrifice layer etching.
Figure 10B:
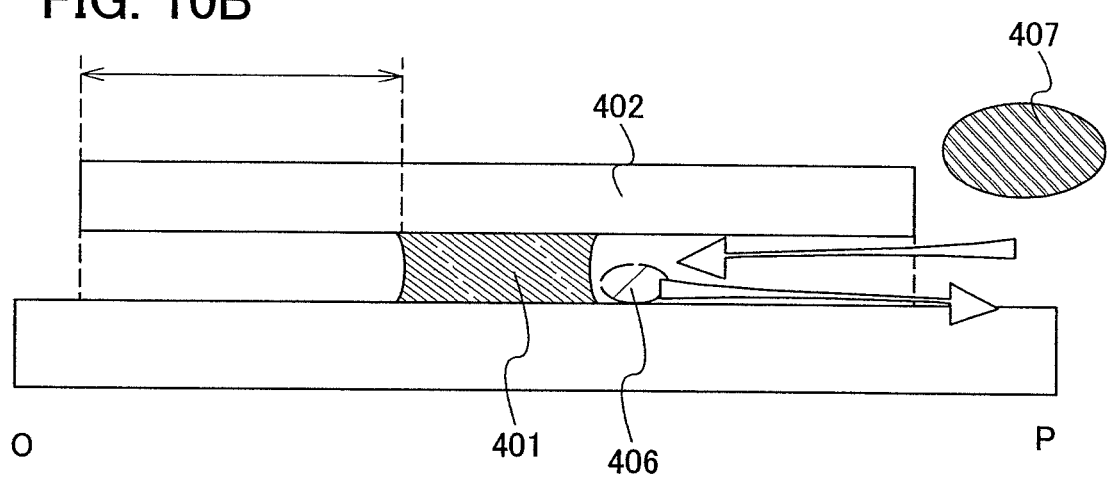

When the sacrifice layer etching is conducted on such a structure by isotropic etching, etching of the sacrifice layer 401 progresses initially as shown in FIG. 8B. After a time t from the start of the etching, the sacrifice layer 401 is removed by a distance R (t) from an end portion of the structural layer 402. Here, a portion 403 where the sacrifice layer 401 has been removed by etching and a portion 404 where the sacrifice layer 401 is left are shown in FIG. 8B. Then, as shown in FIG. 8C, the etching stops at a certain time $t_{max}$ from the start of the etching. The sacrifice layer 401 has been removed by a distance R $(t_{max})$=$R_{max}$ from an end portion of the structural layer 402. FIG. 10A is a perspective view of a structure shown in FIGS. 8B and 8C and FIG. 10B is a cross-sectional view along a line O—P in FIG. 10A.

Figure 9:
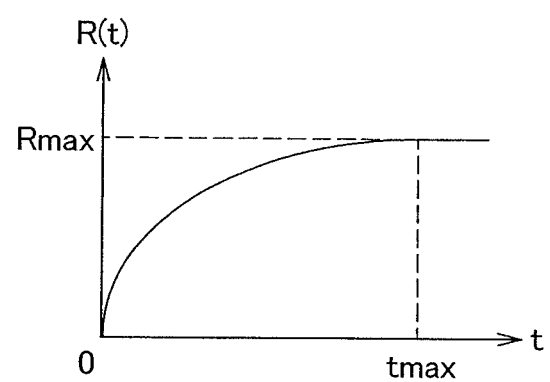
FIG. 9 shows sacrifice layer etching.

If isotropic sacrifice layer etching is conducted on the structure that forms a long tunnel as shown in FIGS. 8A to 8C and FIGS. 10A and 10B, the distance R (t) from the end portion of the structural layer 402 over which the sacrifice layer 401 is etched depends on the time as shown in FIG. 9. In FIG. 9, the horizontal axis shows the time t from the start of the etching and the vertical axis shows the distance R (t) over which the etching is conducted. As shown by such a tunnel structure, in the case where the sacrifice layer 401 recedes so deeply under the structural layer 402 with the progress of the sacrifice layer etching that it is difficult for the etchant to flow in to the vicinity of the sacrifice layer 401, the distance $R_{max}$ over which the sacrifice layer 401 is etched is saturated at the certain time $t_{max}$ as shown in FIG. 9. The sacrifice layer etching does not progress any more even if the etching is continued further because of the following reasons. Since the structural layer 402 has the long-tunnel structure, the sacrifice layer 401 recedes deeply under the structural layer 402 with the progress of etching of the sacrifice layer 401. Thus, a reaction product 406 of the sacrifice layer 401 and the etchant is likely to remain in the tunnel, and an etchant 407 capable of reaction does not flow in easily. When the sacrifice layer 401 recedes to the distance that is out of the reach of the etchant 407 by diffusion, the sacrifice layer etching stops. At this time, the distance over which the etching has been conducted corresponds to $R_{max}$.

Although FIGS. 8A to 8C and FIGS. 10A and 10B have shown the example in which the structural layer 402 has the tunnel structure, the shape of the structural layer 402 is not limited to this. That is to say, as in the tunnel structure, the sacrifice layer is left in the structure in which it is difficult for the etchant to flow in to the vicinity of the sacrifice layer 401 because the depth is long in proportion with the area of the opening like in the tunnel structure and the sacrifice layer 401 recedes to the inside surrounded by the structural layer 402 and the insulating substrate.

The maximum distance $R_{max}$ over which the etching is conducted and the time $t_{max}$ required for the etching depend on various factors such as the materials and structures of the sacrifice layer 401 and the structural layer 402, the material of the etchant for etching the sacrifice layer 401, and the etching method, condition, and the like for the sacrifice layer 401. However, the distance R (t) over which the etching is conducted is saturated at a certain distance $R_{max}$ even if any method, material, condition, and the like are combined.

If a micromachine is manufactured under a condition that the distance R over which the sacrifice layer 401 is to be removed by the sacrifice layer etching is larger than the maximum distance $R_{max}$ over which the etching is conducted, a problem is caused in that the sacrifice layer 401 remains under the structural layer 402.

As thus described, the etching rate gets slower with the increase in the time t from the start of the etching, and the etching stops at the distance $R_{max}$ when the time t exceeds the certain time $t_{max}$.

The above problem is caused because the reaction product 406 and the etchant become difficult to diffuse. Accordingly, in the present invention, the etchant is made to flow so that the reaction product 406 diffuses from the periphery of the sacrifice layer 401 and moreover so that the etchant 407 capable of reaction exists around the sacrifice layer 401. Then, the etching rate can be accelerated even when the time t from the start of the etching increases, and the maximum distance $R_{max}$ over which the etching is conducted can be increased. As a result, the degree of freedom in designing the micromachine can be increased.

If the aforementioned method is carried out by dry etching, for example, the etchant 407 capable of reaction can be controlled so as to exist around the sacrifice layer 401 by introducing the etchant and exhausting the gas in an apparatus.

Figure 11:
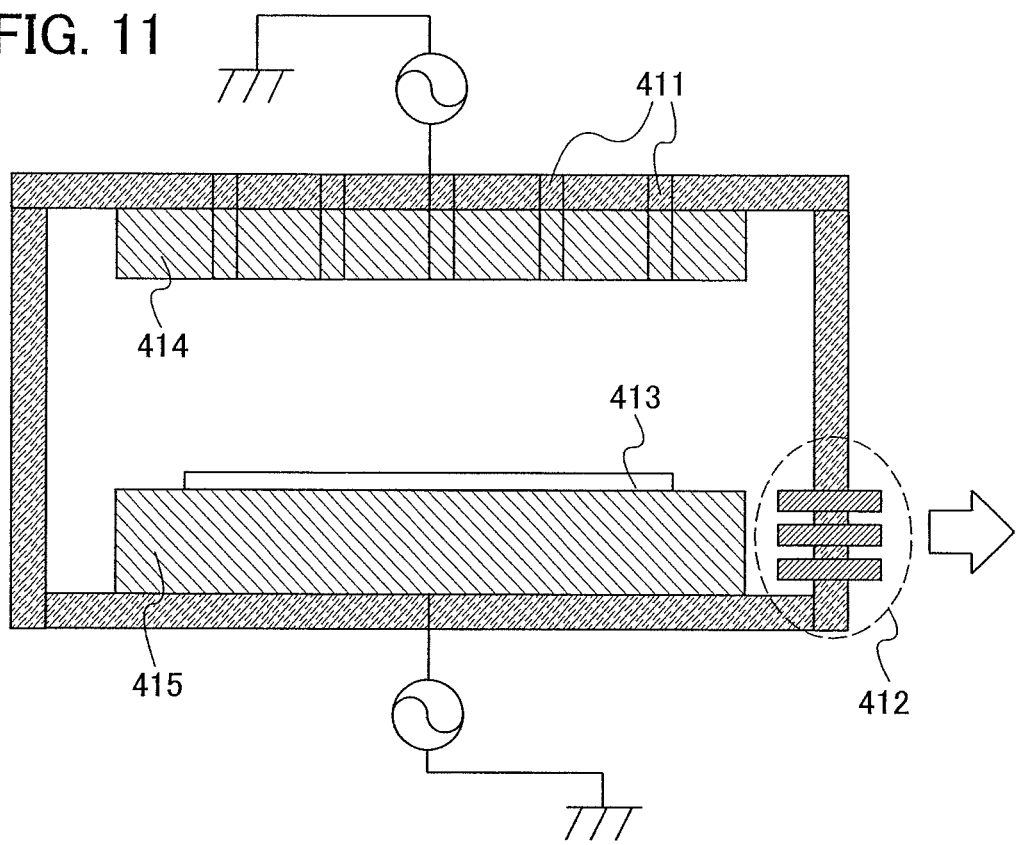
FIG. 11 shows a dry etching apparatus.

An apparatus for carrying out dry etching provided with such a structure is shown in FIG. 11. This dry etching apparatus has an upper electrode 414 provided with an introduction port 411 of an etchant, a lower electrode 415, and an exhaust port 412. An insulating substrate 413 where a sacrifice layer is formed over the lower electrode 415 is provided, and voltage is applied to the lower electrode 415 and the upper electrode 414 to generate plasma; thus, etching is conducted. At this time, the etchant in a gas form is exhausted from the exhaust port 412. Moreover, the introduction and exhaust of the etchant can be alternately conducted. The dry etching apparatus is not limited to the structure shown in FIG. 11 and, for example, the introduction port 411 may be provided separately from the upper electrode 414. Moreover, the exhaust port 412 may be provided under the apparatus.

In general, the dry etching apparatus in the case of manufacturing a semiconductor element controls the flow rate of the etchant introduced from the introduction port 411 and the amount of gas exhausted from the exhaust port 412 to keep the pressure constant in the apparatus; thus, dry etching is conducted. However, since a large amount of material is removed in the case of the sacrifice layer etching, using a general method may lead to problems in that the etching rate gets extremely slow and that a reaction product of the etchant and the sacrifice layer is deposited over the insulating substrate.

Therefore, in the dry etching apparatus of this embodiment mode, the sacrifice layer etching is conducted by a method in which the amount of the etchant to be introduced is increased to perform the etching and the amount of gas to be exhausted is increased after a certain period of time. That is to say, in this embodiment mode, the sacrifice layer etching is conducted while changing the pressure in the apparatus by introducing and exhausting the gas.

The gas is exhausted in order to remove the reaction product formed by a chemical reaction between the sacrifice layer and the etchant and to make it easier to introduce the etchant to the vicinity of the sacrifice layer; therefore, the degree of vacuum is not necessarily increased. However, the inside of the apparatus is preferably high vacuum because the reaction product is not easily deposited over the insulating substrate.

Moreover, an additional step may be conducted to generate plasma by introducing inert gas such as argon or helium from the introduction port 411 so that the reaction product deposited over the insulating substrate 413 is removed physically. For example, the sacrifice layer etching can be conducted in the following order: (1) the etching is conducted by introducing the etchant, (2) the gas in the apparatus is exhausted, and (3) the reaction product is removed by introducing inert gas. In Step (3), the reaction product can also be removed efficiently by exhausting the gas at the same time. Steps (1) to (3) can be arbitrarily combined or repeated as necessary.

The gas used in Step (3) is not limited to inert gas, and a reactive gas that can react with the reaction product of the sacrifice layer and the etchant and remove the reaction product may be used. Here, the aforementioned reactive gas is a reactive gas other than the etchant. The amount of etchant or gas to be introduced to remove the reaction product, the amount of gas to be exhausted in the etching apparatus, the number of times of repeating the steps, and the like can be determined based on the film thickness of the sacrifice layer, the kind of the etchant and the sacrifice layer, and the like. The amount of etchant and noble gas to be introduced, the amount of gas to be exhausted, the number of times of repeating the steps, and the like can be determined based on the film thickness of the sacrifice layer, the kind of the sacrifice layer and the etchant, and the like.

In accordance with such a dry etching method, the reaction product 406 remaining in the vicinity of the sacrifice layer 401 as shown in FIG. 10B will no longer remain in the vicinity of the sacrifice layer 401 and a new etchant 407 capable of reaction easily diffuses to the vicinity of the sacrifice layer 401. Thus, the sacrifice layer etching can be conducted in a short period of time.

Moreover, if the sacrifice layer etching is wet etching, the above method can be realized by vibrating the substrate or a container of etchant or making the etchant flow.

Figure 12A:
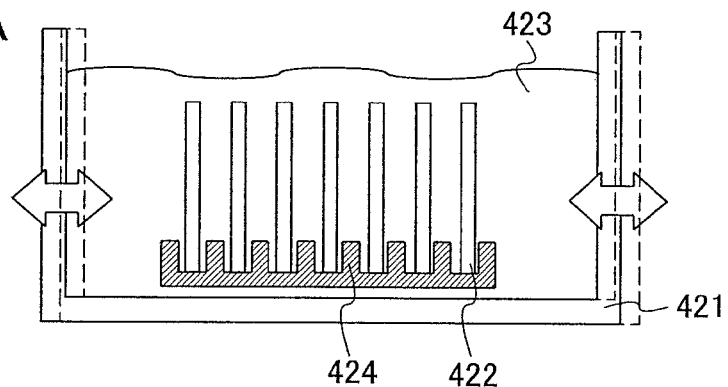
FIGS. 12A to 12D show a wet etching method.

FIGS. 12A to 12D show a wet etching method to achieve the aforementioned method. In a wet etching apparatus, insulating substrates 422 each of which has a sacrifice layer formed thereover and stands on a substrate holder 424 can be soaked in a liquid etchant 423 filled in a container 421. Here, in order to make the etchant flow, a method of vibrating the container 421 is given as shown in FIG. 12A.

Figure 12B:
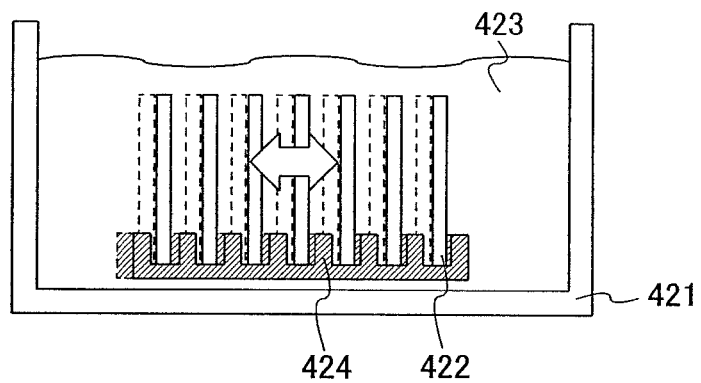

Moreover, in order to make the etchant flow, a method of vibrating the insulating substrate 422 by vibrating the substrate holder 424 is given as shown in FIG. 12B.

Figure 12C:
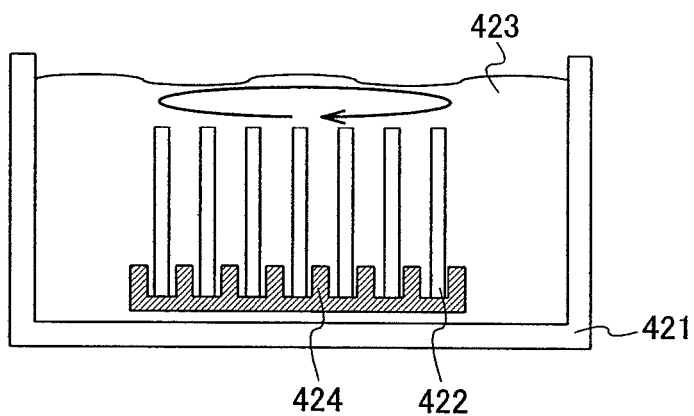

Furthermore, in order to make the etchant flow, a method of agitating the etchant is given as shown in FIG. 12C.

Figure 12D:
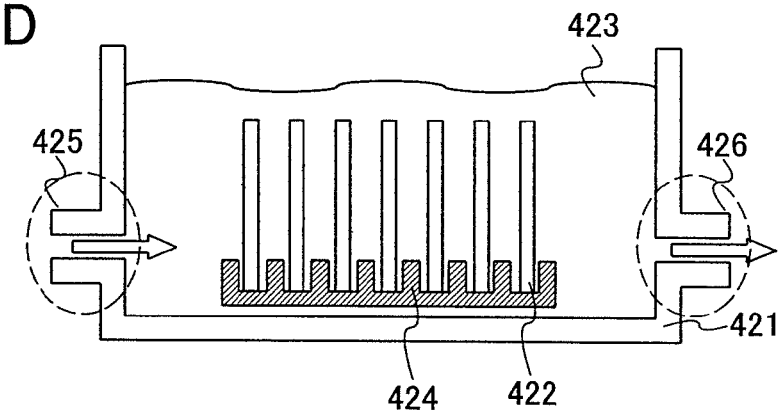

In addition, in order to make the etchant flow, a method in which an introduction port 425 and an exhaust port 426 of the etchant are provided in the container 421 to introduce and exhaust the etchant is given as shown in FIG. 12D.

By making the etchant flow in this way, the sacrifice layer etching can be conducted in a short period of time. Moreover, the sacrifice layer can be prevented from remaining because the reaction with the etchant progresses.

Thus, since the etching rate can be improved by using the method for manufacturing a micromachine of the present invention, the time required for the sacrifice layer etching can be shortened. In addition, since the maximum distance $R_{max}$ shown in FIG. 9 over which the etching is conducted can be increased, the degree of freedom in designing the micromachine can be increased.

This embodiment mode can be freely combined with the aforementioned embodiment mode.

Embodiment Mode 5

A micromachine of the present invention has a structural body and an electric circuit having a semiconductor element, and the structural body has a structural layer and a space formed by removing a sacrifice layer. A part of the structural layer can move in the space. Here, the electric circuit includes, for example, a wireless communication circuit, a memory, a control circuit, and the like. This embodiment mode will describe a structure of such a micromachine. The memory has a semiconductor element and a storage element.

Figure 13A:
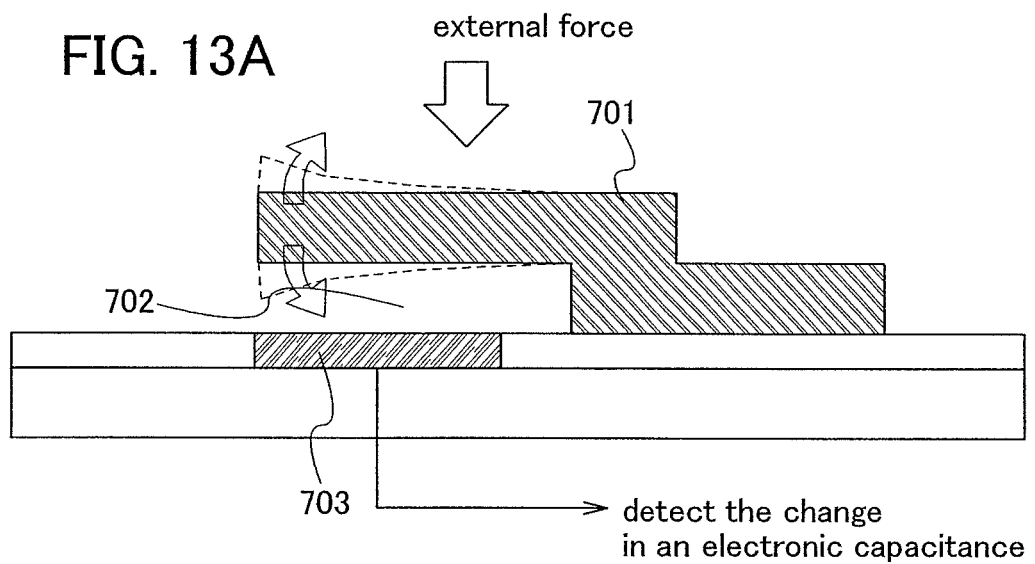
FIGS. 13A and 13B show a micromachine of the present invention.

As shown in FIG. 13A, the structural body in the micromachine of the present invention has a structural layer 701 and a lower electrode 703, and has a space 702 between the structural layer 701 and the lower electrode 703. The structural layer 701 can move up and down by an external force. By such a structural body, change in electrostatic capacitance between the structural layer 701 and the lower electrode 703 can be known, and the structural body serves as a sensor that can detect the change in the electrostatic capacitance.

Figure 13B:
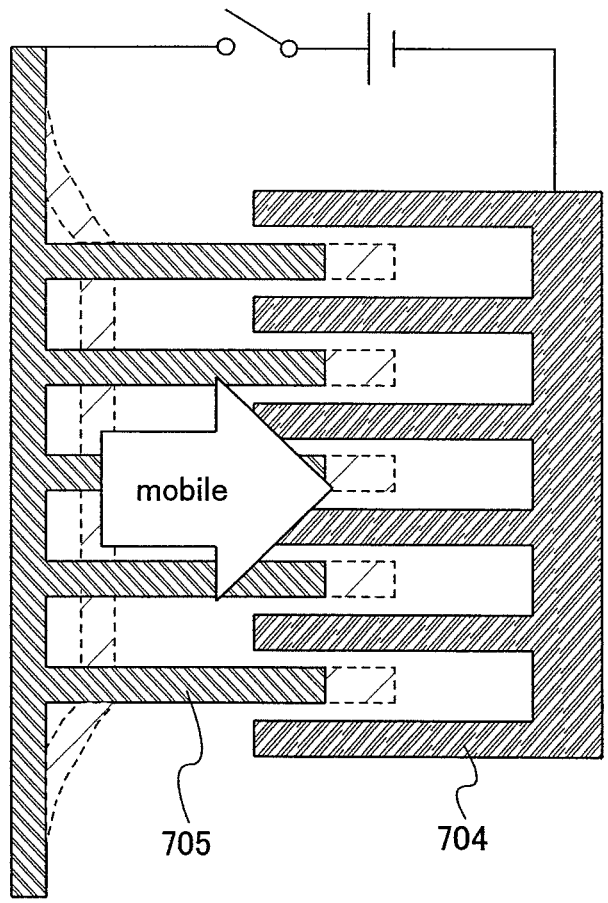

As shown in FIG. 13B, the structural body has a fixed comb 704 and a movable comb 705, and has spaces between the fixed comb 704 and the movable comb 705 and between the movable comb 705 and the insulating substrate. When voltage is applied between the fixed comb 704 and the movable comb 705 to use the movable comb as an electrode, the structural body serves as an actuator that can change an electric signal inputted from the outside into displacement.

Besides the aforementioned example, an unmovable structural body that has a structural layer and a space formed by removing a sacrifice layer can be formed. In other words, the structural body corresponds to an inductor, a capacitor, a waveguide, or the like in which only a wire is formed on the substrate and the structural layer is formed apart from the substrate. Since the structural layer is formed apart from the substrate, interaction thereof with the substrate can be reduced; therefore, such a structural body can be used for a wireless communication circuit that mainly operates at high frequency.

The aforementioned structural body is an example, and the structural body can have a shape and be formed with steps in accordance with its purpose and can be provided with a predetermined function by various driving methods. For example, even in the case of forming the structural body having the same structure, different functions can be provided depending on the driving methods.

Figure 14A:
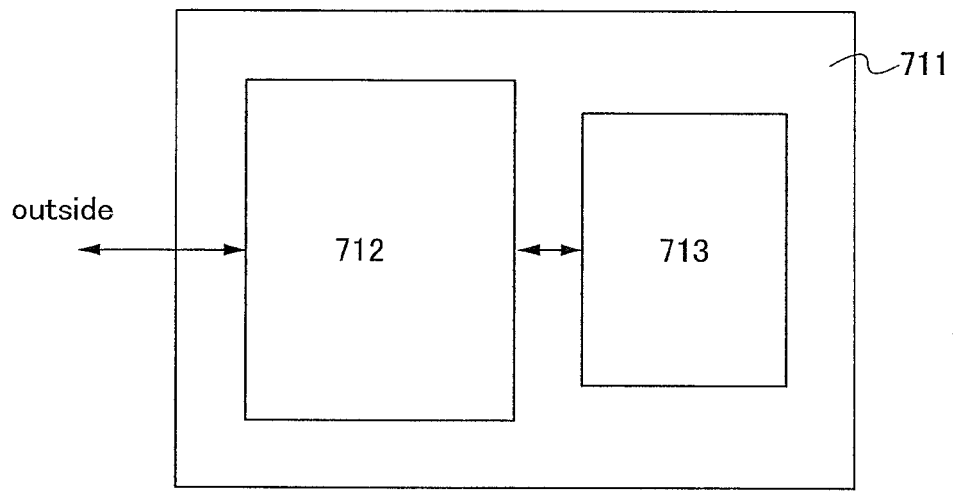
FIGS. 14A to 14C show micromachines of the present invention.

A micromachine 711 can have an electric circuit portion 712 and a structure portion 713 formed by a structural body, as shown in FIG. 14A. For example, if the structure portion 713 is a sensor that detects change in electrostatic capacitance, the micromachine 711 can detect physical amount such as pressure or acceleration by the sensor, and the detected amount can be processed and outputted by the electric circuit portion 712.

Further, if the structure portion 713 is the actuator as described above, the micromachine 711 can process an electric signal inputted from the outside in the electric circuit portion 712 and output displacement or force through the actuator.

Figure 14B:
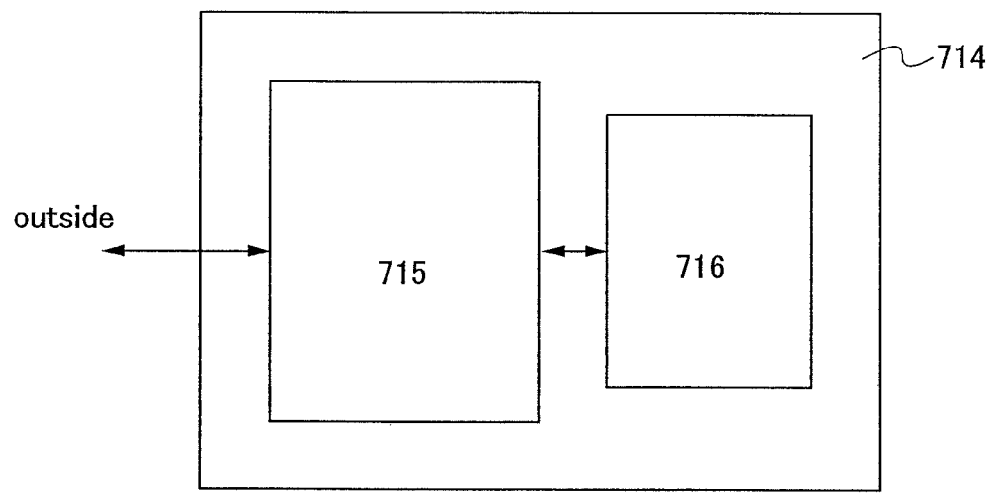

Further, as shown in FIG. 14B, a micromachine 714 has a wireless communication circuit 715 and another electric circuit 716, by which wireless communication with the outside can be carried out. Here, the other electric circuit corresponds to, for example, an information processing circuit, a memory, a control circuit, or the like. Moreover, the wireless communication circuit has an antenna, a power source circuit, or the like to perform wireless communication with an external device through electromagnetic waves. A passive element that forms the wireless communication circuit, such as an inductor or a capacitor, can be formed by a structural body which has a structural layer and a space formed by removing a sacrifice layer and in which two layers having a conductive property (hereinafter called conductive layer) face each other with a space therebetween.

Figure 14C:
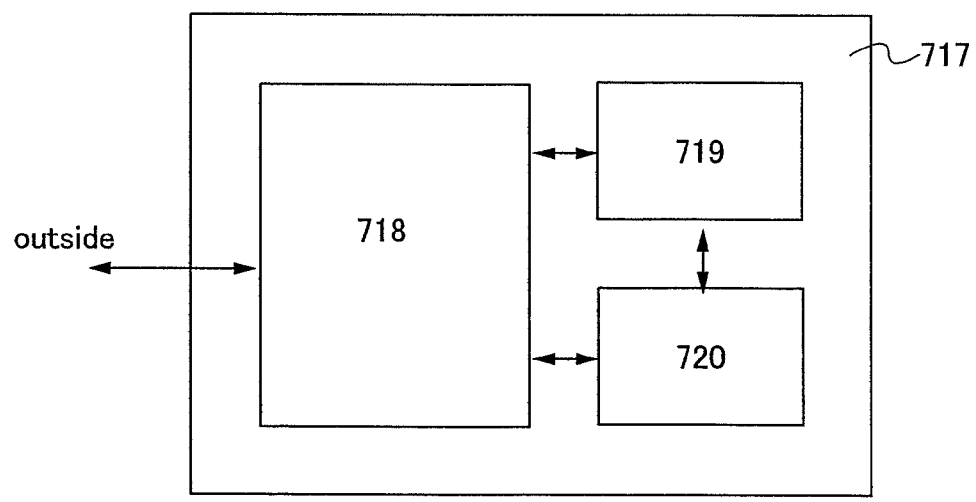
Figure 27A:
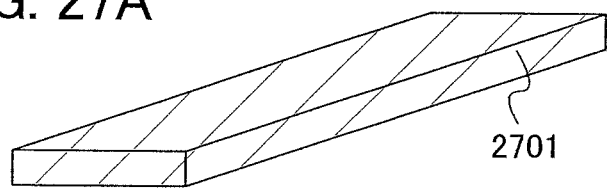
FIGS. 27A to 27C show a method for manufacturing a micromachine of the present invention.
Figure 27B:
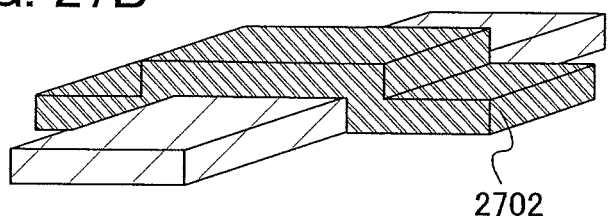
Figure 27C:
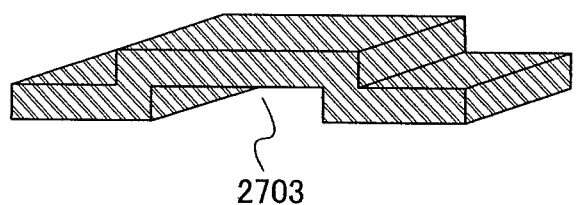

In addition, as shown in FIG. 14C, a micromachine 717 can be formed by a wireless communication circuit 718, a structure portion 719, and another electric circuit 720. The other electric circuit 720 has an information processing circuit, a memory, a control circuit, or the like similarly to the above example. The structure portion has a sensor or an actuator, which is a structural body, and the micromachine can send information and receive control to/from the outside through the wireless communication circuit. This wireless communication circuit can also have a passive element formed as a structural body having a space and a structural layer.

The structural body in the micromachine of the present invention can form not only a sensor or an actuator but also a passive element as above. In a circuit for performing wireless communication, the passive element (capacitor, inductor, resistor, or the like) is important; however, these passive elements have been difficult to form by general steps for forming a semiconductor element. However, by forming the passive element using the structural body, favorable characteristics can be obtained.

This embodiment mode can be freely combined with the above embodiment modes.

Embodiment Mode 6

This embodiment mode will show specific examples of a method for manufacturing a structural body in a micromachine. Here, a method for manufacturing a switch that decides conduction or nonconduction by physical contact or noncontact will be described with reference to FIGS. 15A to 17B2. In each drawing used here, a top view is shown on the left side while a cross-sectional view is shown on the right side.

First, as shown in FIGS. 15A1 to 15A2, a conductive layer 501 is formed over a substrate 502. The conductive layer 501 may be directly formed on the substrate 502, or the conductive layer 501 may be formed after forming a base layer 503 on the substrate 502. In FIG. 15A1 which is a top view, the substrate 502 and the base layer 503 are omitted. FIG. 15A1 shows an example in which the conductive layer 501 is formed after forming the base layer 503 over the substrate 502. The conductive layer 501 can be formed in such a way that a conductive layer is processed by resist patterning by photolithography and a dry or wet etching method. The conductive layer 501 is formed as a pair of electrodes, which controls driving of a switch.

Subsequently, as shown in FIGS. 15B1 to 15B2, an insulating layer 504 is formed over the conductive layer 501, and conductive layers 505 and 506 are formed over the insulating layer 504. The insulating layer 504 can be formed by a CVD method, a sputtering method, or the like. The conductive layers 505 and 506 can be formed and processed between the pair of conductive layers 501 in a similar manner to the aforementioned conductive layer 501. Since the conductive layers 505 and 506 formed here function as a conducting route of a signal, the conductive layers 505 and 506 are formed as a pair of electrodes. That is to say, the pair of conductive layers 501 and the pair of conductive layers 505 and 506 are provided in a cross shape. It is to be noted that the substrate 502, the base layer 503, and the insulating layer 504 are omitted in the top view of FIG. 15B1.

Subsequently, as shown in FIGS. 15C1 and 15C2, a sacrifice layer 507 is formed over the conductive layers 505 and 506. The sacrifice layer 507 can be formed and processed in a similar manner to the aforementioned conductive layers. The sacrifice layer 507 formed here is removed in later sacrifice layer etching, and the portion where the sacrifice layer 507 existed becomes a space. It is to be noted that the substrate 502, the base layer 503, and the insulating layer 504 are omitted in the top view of FIG. 15C1.

Next, as shown in FIGS. 16A1 and 16A2, conductive layers 508 and 509 are formed over the sacrifice layer 507. The conductive layers 508 and 509 can be formed and processed in a similar manner to the aforementioned conductive layers 505 and 506 and sacrifice layer 507. The conductive layer 509 becomes a contact electrode which conducts along a conducting route by being in contact with the conductive layers 505 and 506, while the conductive layer 508 becomes a driving electrode which drives a switch by applying voltage between the conductive layer 508 and the conductive layer 501. Thus, the conductive layer 508 is provided so as to face the pair of conductive layers 501 with the insulating layer 504 and the sacrifice layer 507 interposed therebetween, and the conductive layer 509 is provided so as to face the pair of conductive layers 505 and 506 with the sacrifice layer 507 interposed therebetween. It is to be noted that the substrate 502, the base layer 503, and the insulating layer 504 are omitted in the top view of FIG. 16A1.

Next, as shown in FIGS. 16B1 and 16B2, a structural layer 510 is formed over the conductive layers 508 and 509. The structural layer 510 can be formed with an insulating material to have a single-layer structure or a multilayer structure, and processed in a similar manner to the above sacrifice layer 507 or the like. The structural layer 510 formed here is to form the shape of the structural body having a bridge structure and to constitute a main portion that can move. It is to be noted that the substrate 502, the base layer 503, and the insulating layer 504 are omitted in the top view of FIG. 16B1.

Subsequently, a space 511 is formed by removing the sacrifice layer 507 by sacrifice layer etching as shown in FIGS. 16C1 and 16C2. In this sacrifice layer etching, a part of the sacrifice layer 507 that does not overlap with the structural layer 510 can be removed by first sacrifice layer etching and then a part of the sacrifice layer 507 that is under the structural layer 510 can be removed by second sacrifice layer etching, as shown in the aforementioned embodiment mode. Then, the conductive layer 509 and the conductive layer 505 face each other with the space 511 therebetween, and the conductive layer 501 and the conductive layer 508 face each other with the space 511 and the insulating layer 504 interposed therebetween. Thus, the structural body 512 having the space 511 formed by removing the sacrifice layer 507 and the structural layer 510 capable of moving in the space 511 can be formed.

Moreover, in the above sacrifice layer etching, it is also possible that most of the sacrifice layer 507 that is under the structural layer 510 is removed by the second sacrifice layer etching, and the rest of the sacrifice layer 507 is removed by third sacrifice layer etching. The part of the sacrifice layer 507 left by the second sacrifice layer etching can be used as a supporter that supports the structural layer 510 to prevent the structural layer 510 from buckling; thus, the attachment when drying can be prevented. It is to be noted that the substrate 502, the base layer 503, and the insulating layer 504 are omitted in the top view of FIG. 16C1.

Moreover, holes 513 can be provided in the structural layer 510 as shown in FIGS. 17A1 and 17A2. Then, as described in the above embodiment mode, the part of the sacrifice layer 507 that does not overlap with the structural layer 510 and a part of the sacrifice layer 507 that is right under the holes 513 can be removed by the first sacrifice layer etching, and the part of the sacrifice layer 507 that is under the structural layer 510 can be removed by the second sacrifice layer etching. In addition, as shown in FIGS. 17B1 and 17B2, a depression 514 can be provided in the insulating layer 504 right under the holes 513 by etching after the first sacrifice layer etching, and then, the second sacrifice layer etching can be conducted. Furthermore, a lyophilic process can be carried out after providing the depression 514 and then the second sacrifice layer etching can be conducted. It is to be noted that the substrate 502, the base layer 503, and the insulating layer 504 are omitted in the top views of FIGS. 17A1 and 17B1.

Next, operation of the structural body 512 manufactured by the above method will be described. The structural body 512 functions as a switch that operates whether to convey a signal or not. Here, FIG. 16C2 shows an OFF state of the switch. Since voltage is not applied between the driving electrodes (i.e., between the conductive layers 501 and 508), the conductive layer 505 and the conductive layer 506 are not electrically connected to each other. FIGS. 18A1 and 18A2 show an ON state of the switch. Here, the structural layer 510 is lowered by applying voltage between the driving electrodes (i.e., between the conductive layers 501 and 508) to generate an electrostatic force. The conductive layers 505 and 506 are electrically connected to each other by lowering the structural layer until the conductive layers 505 and 506 come into contact with the conductive layer 509. Since the conductive layers 505 and 506 and the conductive layer 509 are provided with the space 511 therebetween, switching operation can be performed in this way.

A switch using an electrostatic attracting force in this way is driven based on balance between an attracting force generated between the driving electrodes (i.e., between the conductive layers 501 and 508) and a force of restitution (=spring constant×displacement) due to the material and structure of the structural layer 510. In other words, the switch can be turned on by applying voltage large enough to generate an electrostatic force that exceeds the force of restitution of the structural layer 510. It is to be noted that the substrate 502, the base layer 503, and the insulating layer 504 are omitted in the top view of FIG. 18A1.

When the holes 513 are provided in the structural layer 510 as shown in FIGS. 17A1 and 17A2, air resistance that acts on a beam portion of the structural layer 510 can be decreased to increase switching speed. The provision of the holes 513 has an advantageous effect of decreasing the remaining stress in the structural layer 510 to reduce the spring constant. In addition, decreasing the mass provides an advantageous effect that mechanical resonance frequency for the beam portion of the structural layer 510 is increased. Further, even though the holes 513 are provided so as to penetrate through the conductive layer 508, the electrostatic capacitance between the driving electrodes is almost the same as that in the case where the holes 513 are not provided if the diameter of each of the holes 513 is larger than the distance between the conductive layers 501 and 508, which are the driving electrodes, by three to four times or less. This is because defects of electrostatic capacitance of the holes 513 can be compensated by a fringing effect.

Although this embodiment mode has shown the structural body 512 with a bridge structure, the structural body can be formed to have, for example, a cantilever structure. It is to be noted that the bridge structure means a structure with its opposite ends fixed to the substrate and its center not in contact with the substrate. The cantilever structure means a structure of the structural body formed over a substrate with only one end thereof fixed to the substrate and the other end not in contact with the substrate. This embodiment mode can be freely combined with any of the above embodiment modes.

Embodiment Mode 7

With reference to FIGS. 19A1 to 20C2, this embodiment mode will describe a specific method for manufacturing a structural body of a micromachine, which is different from the structural bodies shown in the above embodiment modes and which can be used as a sensor. In each drawing used here, a top view is shown on the left side and a cross-sectional view is shown on the right side.

As shown in FIGS. 19A1 and 19A2, a first conductive layer 601 is formed over a substrate 602. The first conductive layer 601 can be formed in such a way that a conductive material is processed by resist patterning by photolithography and a dry or wet etching method. The first conductive layer 601 can have a single-layer or multilayer structure. FIGS. 19A1 and 19A2 show the case in which the first conductive layer 601 is formed in a single-layer structure after forming a base layer 603 over the substrate 602. It is to be noted that the substrate 602 and the base layer 603 are omitted in FIG. 19A1.

Next, as shown in FIGS. 19B1 and 19B2, a sacrifice layer 604 is formed over the first conductive layer 601. The sacrifice layer 604 can be formed and processed in a similar way to the first conductive layer 601. Subsequently, as shown in FIGS. 19C1 and 19C2, a second conductive layer 605, an insulating layer 606, and a third conductive layer 607 are stacked over the sacrifice layer 604. Here, the second conductive layer 605 and the third conductive layer 607 can be formed in a similar manner to the first conductive layer 601, and the insulating layer 606 can be formed using an insulating material. Over these layers, a resist can be formed by photolithography and the resist can be processed in a self-aligning manner by a dry or wet etching method. The second conductive layer 605, the insulating layer 606, and the third conductive layer 607 (these three layers are also referred to as a structural layer collectively in this embodiment mode) function as a movable structure portion. It is to be noted that the substrate 602 and the base layer 603 are omitted in FIGS. 19B1 and 19C1.

Next, the sacrifice layer 604 is removed by sacrifice layer etching to form a space 608 as shown in FIGS. 19D1 and 19D2. Here, a part of the sacrifice layer 604 that does not overlap with the second conductive layer 605 can be removed by first sacrifice layer etching and a part of the sacrifice layer 604 that is under the second conductive layer 605 can be removed by second sacrifice layer etching, in a similar manner to the above embodiment mode.

In addition, holes 609 can be provided in the structural layer as shown in FIGS. 20A1 and 20A2. In this case, the procedure can be as follows as explained in the above embodiment mode: (1) a part of the sacrifice layer 604 that is right under the holes 609 is removed by the first sacrifice layer etching, (2) a depression 610 is provided in the first conductive layer 601 that will become a lower electrode, and then (3) the part of the sacrifice layer 604 that is under the structural layer is removed by the second sacrifice layer etching.

In the case of not providing the holes in the structural layer, a groove 611 having a similar function to the depression 610 can be provided in the first conductive layer 601 as shown in FIGS. 20B1 and 20B2. The groove 611 has a comb-like shape when viewed from above (see FIG. 20B1). Specifically, the first conductive layer 601 is provided with the groove 611 arbitrarily. Alternatively, the groove 611 can be formed after forming the first conductive layer 601, and after that, the sacrifice layer 604 can be formed.

In addition, as shown in FIGS. 20C1 and 20C2, a layer 612 that overlaps with the structural layer can be formed and then the sacrifice layer etching can be carried out. In FIG. 19D1 and FIGS. 20A1, 20B1, and 20C1, the substrate 602 and the base layer 603 are omitted.

In the structural body manufactured as above, an end of the structural layer formed to have a cantilever shape is movable by an external force (such as pressure or acceleration). Then, since the electrostatic capacitance between the first conductive layer 601 and the second conductive layer 605 changes by the movement of the structural layer, the structural body can function as a sensor by detecting the displacement. For example, a voltage V1 and a voltage V2 are applied to the first conductive layer 601 and the third conductive layer 607 and a voltage Vx of the second conductive layer 605 is detected; thus, the displacement of the structural layer can be detected.

Although this embodiment mode has shown the example of the structural body having the structural layer with a cantilever shape, the structural body may have a structural layer with a bridge structure as shown in the above embodiment mode. This embodiment mode can be freely combined with any of the above embodiment modes.

Embodiment Mode 8

This embodiment mode will describe a method for forming a structural body and a semiconductor element of a micromachine over one insulating substrate. Here, description is made of an example in which the semiconductor element is a thin film transistor formed by stacking thin films and the structural body is a switch similar to that in the above embodiment mode. In each drawing used here, the semiconductor element is shown on the right side and the structural body is shown on the left side. Moreover, the top view is shown on the upper side and the cross-sectional view is shown on the lower side.

As shown in FIGS. 21A1 and 21A2, a first layer 302 is formed over a substrate 301. Here, the first layer 302 may be formed directly on the substrate 301; however, a layer serving as a protection film is desirably formed in advance in a single-layer or multilayer structure. FIG. 21A2 shows an example of forming two layers of protection layers 303a and 303b over the substrate and forming the first layer 302 over the protection layers 303a and 303b. Each of the protection layer 303a and 303b is formed with a material such as silicon oxide, hafnium oxide, silicon nitride, or hafnium nitride. The first layer 302 can be formed in such a way that a thin film formed with a material having a semiconductor property, for example, silicon, germanium, or the like is processed by resist patterning by photolithography and a dry or wet etching method. The first layer 302 functions as a semiconductor layer in the semiconductor element and functions as a lower driving electrode in the structural body. It is to be noted that the substrate 301 and the protection layers 303a and 303b are omitted in FIG. 21A1.

Subsequently, as shown in FIGS. 21B1 and 21B2, an insulating layer 304 is formed over the first layer 302 and a second layer 305 is formed over the insulating layer 304. The insulating layer 304 can be formed with an oxide of a semiconductor material or a metal, or a nitride of a semiconductor material or a metal. For example, the insulating layer 304 can be formed with silicon oxide or hafnium oxide by a high-density plasma CVD method. Then, the second layer 305 can be formed by processing a conductive material in a similar manner to the first layer 302. For example, the second layer 305 can be formed in a single-layer or multilayer structure by using tungsten, aluminum, tantalum, or a nitride thereof; a conductive material; a silicide formed by adding a metal such as nickel or iron on silicon and applying heat thereto; or the like. FIG. 21B2 shows an example of forming the second layer 305 in a single-layer structure. This second layer 305 functions as a gate electrode in the semiconductor element and functions as a conducting route of a signal in the structural body. It is to be noted that the substrate, 301, the protection layers 303a and 303b, and the insulating layer 304 are omitted in FIG. 21B1.

Next, high-concentration impurity regions 306 and 307 are formed as shown in FIGS. 22A1 and 22A2 by selectively implanting impurity elements in the first layer 302. The high-concentration impurity regions 306 and 307 have high conductivity. As the impurity element, either an impurity imparting P-type or N-type conductivity to a semiconductor or both of them can be implanted selectively. FIGS. 22A1 and 22A2 show an example in which the N-type high-concentration impurity region 306 is formed by implanting the impurity imparting N-type conductivity in the first layer 302 that forms the left semiconductor element and the P-type high-concentration impurity region 307 is formed by implanting the impurity imparting P-type conductivity in the first layer 302 that forms the right semiconductor element.

After forming the second layer 305, a sidewall can also be formed around the second layer 305 in the following manner: an impurity element is implanted in the first layer 302 at low concentration, an insulating layer is formed over the second layer 305, and then the insulating layer is removed by anisotropic etching. After that, the high-concentration impurity region and a low-concentration impurity region can also be formed in the semiconductor layer (first layer 302) by implanting the impurity element at high concentration. The provision of the impurity regions with different impurity concentrations in the semiconductor layer in this way can improve the reliability of the semiconductor element.

Next, as shown in FIGS. 22B1 and 22B2, a third layer 308 is formed over the second layer 305. The third layer 308 is formed by processing an insulating material in a similar manner to the above second layer 305. In the semiconductor element, the third layer 308 is formed to serve as an interlayer insulating layer in which a contact portion between a later-formed fourth layer 309 and the second layer 305 is formed. In the structural body, the third layer 308 is formed to serve as a sacrifice layer. It is to be noted that the substrate 301, the protection layers 303a and 303b, and the insulating layer 304 are omitted in FIGS. 22A1 and 22B1.

Next, as shown in FIGS. 23A1 and 23A2, the fourth layer 309 is formed after removing a part of the insulating layer 304 that is over the first layer 302 and that does not overlap with the third layer 308. The fourth layer 309 is formed by processing a conductive material in a similar manner to the third layer 308. The fourth layer functions as a wire that electrically connects elements in the semiconductor element and functions as a contact electrode and an upper driving electrode in the structural body.

Next, a fifth layer 310 is formed over the fourth layer 309 as shown in FIG. 23B. The fifth layer 310 can be formed by processing an insulating material in a similar manner to the fourth layer 309. The fifth layer 310 functions as a protection layer covering the entire semiconductor element and functions as a structural layer in the structural body. It is to be noted that the substrate 301, the protection layers 303a and 303b, and the insulating layer 304 are omitted in FIGS. 23A1 and 23B1.

Subsequently, as shown in FIGS. 24A1 and 24A2, the third layer 308 that forms the structural body portion, i.e., the sacrifice layer is removed by sacrifice layer etching, thereby forming a space 311. The space 311 is surrounded by the fourth layer 309 and the fifth layer 310 on its top side, the fifth layer 310 on its lateral side, and the insulating layer 304 and the second layer 305 on its bottom side. Here, the third layer 308 existing in the semiconductor element portion is not removed because it is not exposed by being covered with the fifth layer 310, and only the third layer 308 in the region where the structural layer is formed is removed. In this sacrifice layer etching, a part of the sacrifice layer (third layer 308) that does not overlap with the structural layer can be removed by first sacrifice layer etching and a part of the sacrifice layer (third layer 308) that is under the structural layer can be removed by second sacrifice layer etching By conducting the sacrifice layer etching in multiple steps in this way, the time required for the sacrifice layer etching can be shortened and the structural layer can be prevented from buckling. It is to be noted that the substrate 301, the protection layers 303a and 303b, and the insulating layer 304 are omitted in FIG. 24A1.

Thus, an N-type thin film transistor 312, a P-type thin film transistor 313, and a structural body 314 functioning as a switch can be formed. The semiconductor element formed by the above manufacturing method can function as a transistor by applying arbitrary voltage to the two high-concentration impurity regions and the gate electrode formed by the second layer. Moreover, the structural body can function as a switch similarly to that shown in the above embodiment mode.

Although this embodiment mode has shown the case in which the structural body and the semiconductor element are formed over one insulating substrate, a storage element of a memory can also be formed over the same insulating substrate as the structural body in addition to the semiconductor element.

This embodiment mode can be freely combined with any of the above embodiment modes.

Embodiment Mode 9

This embodiment mode shows an example which is different from the above embodiment modes in that a plurality of structural bodies having different functions are formed through the same process. An example in which elements functioning as an inductor, a variable capacitor, a switch, and a sensor are formed at the same time will be shown here.

A method for manufacturing an inductor is described with reference to FIGS. 25A1 to 25D2. First, as shown in FIGS. 25A1 and 25A2, a first conductive layer 902 is formed over a substrate 901. A semiconductor substrate, a glass substrate, a plastic substrate, a metal substrate, or the like can be used as the substrate 901. These substrates can be used as they are, or the substrates each having a protection film formed thereover can also be used. FIG. 25A2 shows an example of forming the first conductive layer 902 after forming a protection layer 903 over the substrate 901. The first conductive layer 902 can be formed in such a way that a conductive material is processed by resist patterning by photolithography and a dry or wet etching method. The first conductive layer 902 has a circular shape and a portion thereof is open. The circular shape of the first conductive layer 902 has its radius continuously changing from one end of the first conductive layer 902 to the other end. This is because a second conductive layer is formed with a swirling shape (also called a winding shape, planar coil shape, or cocentric circular shape) in a later step. Here, the first conductive layer 902 has a conductive layer having a circular shape; a conductive layer having a first rod shape, which is connected electrically to an end of the conductive layer having a circular shape; and a conductive layer having a second rod shape, which is physically apart from the center of the conductive layer having a circular shape. The shape of the first conductive layer 902 is not limited to this, and is determined depending on a final form of an inductor.

Next, a sacrifice layer 904 is formed over the first conductive layer 902 as shown in FIGS. 25B1 and 25B2. The sacrifice layer 904 can be formed by resist patterning by photolithography and a dry or wet etching method. The sacrifice layer 904 is provided with openings 921 and 922 to have contact with the first conductive layer 902. The openings 921 and 922 are formed by a dry or wet etching method. The openings 921 and 922 are provided in order to electrically connect the first conductive layer 902 to the subsequently-formed conductive layer. Thus, in FIGS. 25B1 and 25B2, although the openings are formed at ends of the first conductive layer 902 that has been processed, the positions of the openings are not limited to these.

Next, as shown in FIGS. 25C1 and 25C2, the second conductive layer 905 and the insulating layer 906 are formed and processed in a self-aligning manner by resist patterning by photolithography and a dry or wet etching method. At this time, the second conductive layer 905 and the insulating layer 906 are each processed to have an swirling shape (also called a winding shape, planar coil shape, cocentric circular shape, or spiral shape). The eddy shape is clockwise in FIG. 25C1; however, it may be counterclockwise. In this embodiment mode, the second conductive layer 905 and the insulating layer 906 are collectively referred to as a structural layer.

Next, the sacrifice layer 904 is removed by sacrifice layer etching to form a space, as shown in FIGS. 25D1 and 25D2. The space is partially in contact with the second conductive layer 905 on its top side and the first conductive layer 902 or the protection layer 903 on its bottom side. The space is entirely open on its lateral side, and the second conductive layer 905 is provided to have a columnar shape in the center of the space. Thus, a structural body 907 functioning as an inductor can be formed. In this manner, the inductor having the space between the substrate 901 and the structural layer can have less interaction with the substrate 901; therefore, the inductor can be used particularly at high frequency regions. It is to be noted that the substrate 901 and the protection layer 903 are omitted in FIGS. 25A1, 25B1, 25C1, and 25D1.

Next, an example of manufacturing a variable capacitor in a similar manner to the above manufacturing method will be shown with reference to FIGS. 26A1 to 26D2.

First conductive layers 912 are formed over a substrate 911 as shown in FIGS. 26A1 and 26A2. A semiconductor substrate, a glass substrate, a plastic substrate, a metal substrate, or the like can be used as the substrate 911. These substrates can be used as they are, or the substrates each having a protection film formed thereover can also be used. FIG. 26A2 shows an example of forming the first conductive layers 912 after forming a protection layer 913 over the substrate 911. The first conductive layers 912 can be formed in such a way that a conductive material is processed by resist patterning by photolithography and a dry or wet etching method.

Next, a sacrifice layer 914 is formed over the first conductive layers 912 as shown in FIGS. 26B1 and 26B2. The sacrifice layer 914 can be formed similarly to the first conductive layers 912.

Next, as shown in FIGS. 26C1 and 26C2, the second conductive layer 915 and the insulating layer 916 are formed and processed in a self-aligning manner by resist patterning by photolithography and a dry or wet etching method. In this embodiment mode, the second conductive layer 915 and the insulating layer 916 are collectively referred to as a structural layer.

Next, the sacrifice layer 914 is removed by sacrifice layer etching to form a space, as shown in FIGS. 26D1 and 26D2. The space is open at one end thereof. In other words, the space is surrounded by the second conductive layer 915 on its top side and lateral side and the protection layer 913 on its bottom side, and is open on another lateral side. Thus, the structural body 917 functioning as a variable capacitor can be formed. Here, when one of the first conductive layers 912 serves as a capacitor electrode and the other serves as a control electrode, the distance between the second conductive layer 915 and the first conductive layer 912 serving as a capacitor electrode changes by applying voltage between the second conductive layer 915 and the first conductive layer 912 serving as a control electrode to lower the structural layer. This can be used as a variable capacitor. It is to be noted that the substrate 911 and the protection layer 913 are omitted in FIGS. 26A1 and 26B1, and the substrate 911, the protection layer 913, and the insulating layer 916 are omitted in FIGS. 26C1 and 26D1.

The sacrifice layer etching in the aforementioned manufacturing method can be conducted in a short period of time by dividing the sacrifice layer etching into multiple steps as shown in the above embodiment modes, and moreover it is possible to prevent the structural layer from being attached to the first conductive layer 912 or the protection layer 913 when drying. In the case of manufacturing a variable capacitor, the structural layer may be provided with a hole. The hole in the structural layer can reduce air resistance.

Moreover, in the above manufacturing method, the structural body functioning as a switch or a sensor as described in the above embodiment mode can be manufactured by adding a step of forming a conductive layer and an insulating layer under the first conductive layer 912 or conducting the sacrifice layer etching after forming a conductive layer over the insulating layer 916.

This embodiment mode can be freely combined with any of the above embodiment modes.

Embodiment 1

With reference to FIGS. 29A and 29B and FIGS. 31A to 32C, this embodiment will describe experiment results of the method for manufacturing a semiconductor device of the present invention that has been described in the above embodiment mode.

An experiment was conducted to confirm that sacrifice layer etching can be carried out in a shorter period of time to improve yield by dividing sacrifice layer etching into first etching for removing a region where a sacrifice layer does not overlap with a structural layer and second etching for removing a region where the sacrifice layer overlaps with the structural layer. Specifically, the experiment was conducted by using substrates with sacrifice layers and structural layers formed under the same condition to compare a conventional etching method and a method of the present invention having the first etching and the second etching.

Figure 29A:
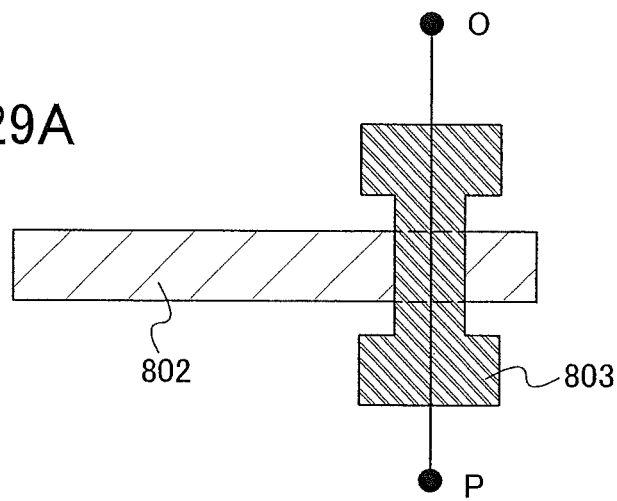
FIGS. 29A and 29B show an experiment of the present invention.
Figure 29B:
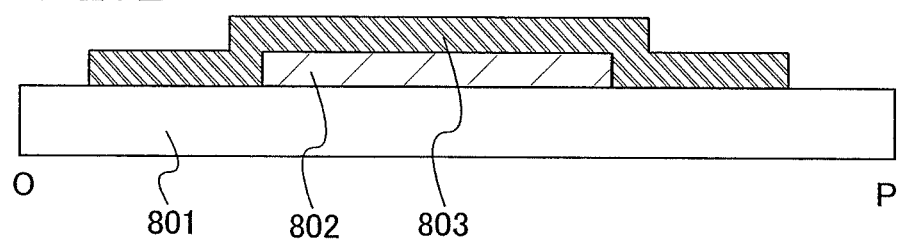

FIG. 29A is a top view of a measurement sample 1, and FIG. 29B is a cross-sectional view along a line O—P of FIG. 29A. The measurement sample 1 is formed by stacking a sacrifice layer 802 and a structural layer 803 sequentially over a substrate 801. The sacrifice layer 802 partially overlaps with the structural layer 803 in the top view, and the sacrifice layer 802 is covered with the structural layer 803 in the cross-sectional view along a line O—P. In other words, the sacrifice layer 802 overlaps with the structural layer 803 in one region and does not overlap with the structural layer 803 in another region. In specific, the sacrifice layer 802 was formed with a thickness of 1 µm using tungsten over a quartz substrate with a length of 5 inches on a side, and the structural layer 803 was formed with a thickness of 0.9 µm over the sacrifice layer 802 using silicon oxynitride. The region where the sacrifice layer 802 overlaps with the structural layer 803 had a width of 8 µm and a length of 10 µm. It is to be noted that the substrate 801 is omitted in FIG. 29A.

First, this sample was subjected to sacrifice layer etching by a conventional method (hereinafter referred to as Experiment 1). The sacrifice layer etching was conducted by a wet etching method using an ammonia peroxide mixture as an etchant for an etching time of 30 minutes. The ammonia peroxide mixture is a liquid in which ammonia, hydrogen peroxide water, and water are mixed at a ratio of 3:5:2.

Figure 31A:
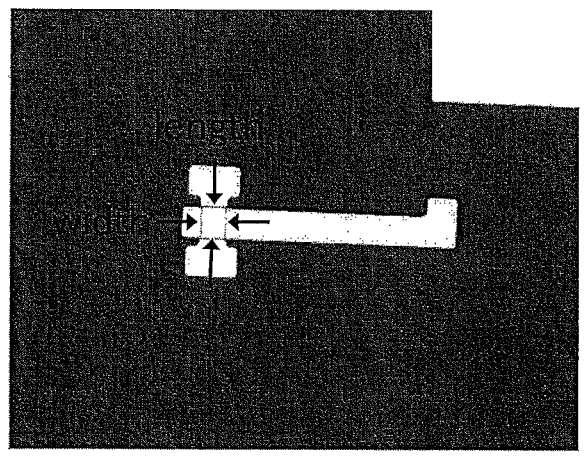
FIGS. 31A to 31C show an experiment of the present invention.
Figure 31B:
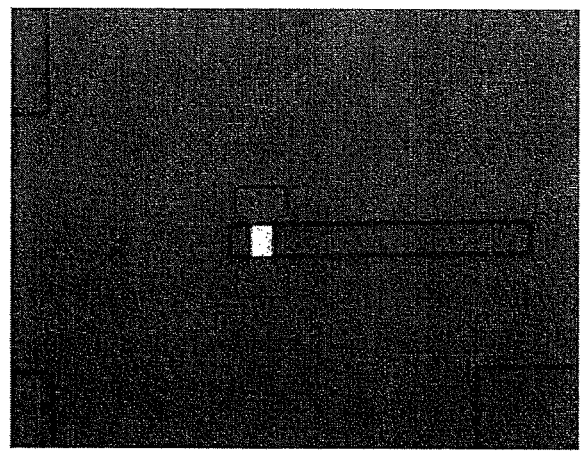
Figure 31C:
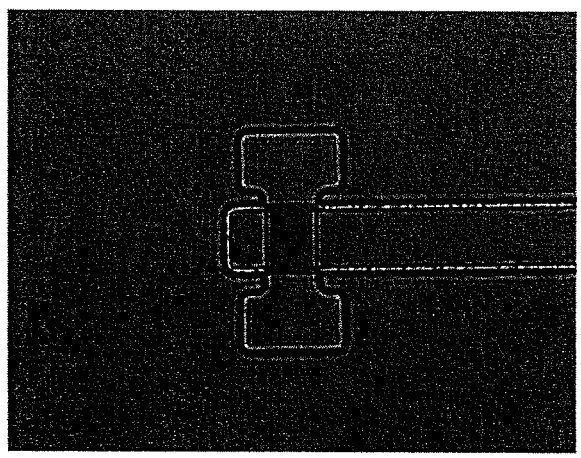

FIG. 31A shows a state prior to the sacrifice layer etching and FIGS. 31B and 31C show a state after the sacrifice layer etching. Moreover, FIGS. 31A and 31B are photographs observed by an incident-light microscope and FIG. 31C is a photograph observed by a transmission microscope. FIGS. 31A and 31B are photographs each taken at 500-fold magnification of the incident-light microscope, and FIG. 31C is a photograph taken at 1000-fold magnification of the transmission microscope. If the incident-light type micrograph is a color photograph, a metal-existing portion is shown in white and a portion having a space between the substrate 801 and the structural layer 803 is shown in yellow-green. In the transmission type micrograph, a metal-existing portion is shown in black. A black-and-white photograph is used in this specification, and a metal-existing portion is shown in white in the incident-light type micrograph. In the transmission type micrograph, a metal-existing portion is shown in black. In the incident-light type micrograph, the portion having a space between the substrate 801 and the structural layer 803 is shown in an intermediate color between white in the incident-light type micrograph and black in the transmission type micrograph.

In FIG. 31A showing the state prior to the sacrifice layer etching, a mask over the structural layer 803 is shown in white. It is to be noted that the mask over the structural layer 803 is the remain of an etching mask used when etching the structural layer 803. The mask is white because tungsten, a metal, is used.

In FIGS. 31B and 31C showing the state after the sacrifice layer etching, the region where the sacrifice layer 802 overlaps with the structural layer 803 is shown in white in FIG. 31B and black in FIG. 31C. Thus, it is understood that the sacrifice layer 802 made of tungsten remains without being removed completely.

Next, a measurement sample 2 having a structural body with the same shape as the measurement sample 1 shown in FIG. 29A was subjected to sacrifice layer etching by the method of the present invention (hereinafter referred to as Experiment 2). The sacrifice layer etching is conducted in two steps: first sacrifice layer etching is conducted by an anisotropic dry etching method and second sacrifice layer etching is conducted by an isotropic wet etching method. The first sacrifice layer etching is conducted under a condition that $CF_4$, $Cl_2$, and $O_2$ are used at a flow rate of 50.4 sccm, 50.4 sccm, and 20.4 sccm respectively, the pressure is set to 1.35 Pa (0.01015 Ton), and electric powers of 500 W and 10 W are applied to an IPC electrode and a bias electrode respectively. The etching stopped when an end point was detected, and the time required was 3 minutes 55 seconds. The second sacrifice layer etching was conducted by wet etching under the same condition as that in Experiment 1.

Figure 32A:
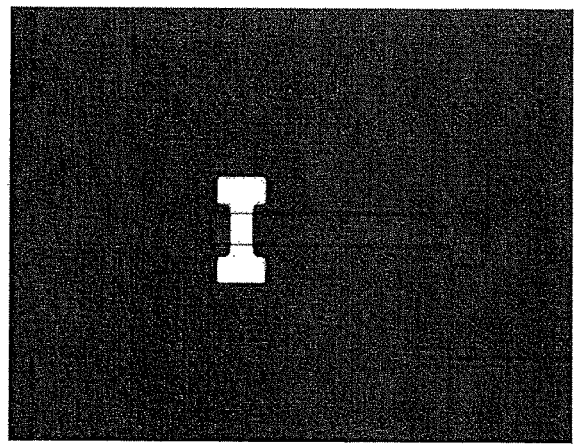
FIGS. 32A to 32C show an experiment of the present invention.
Figure 32B:
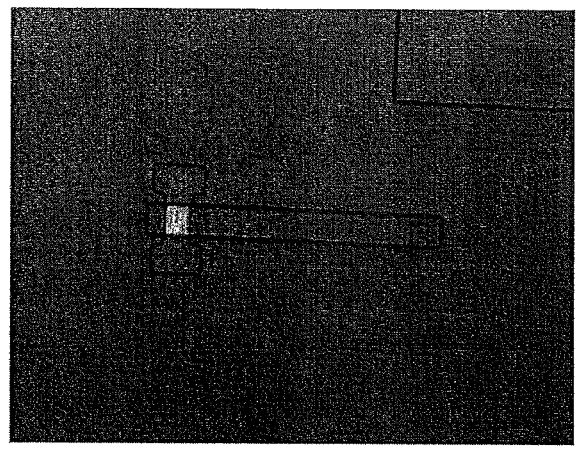
Figure 32C:
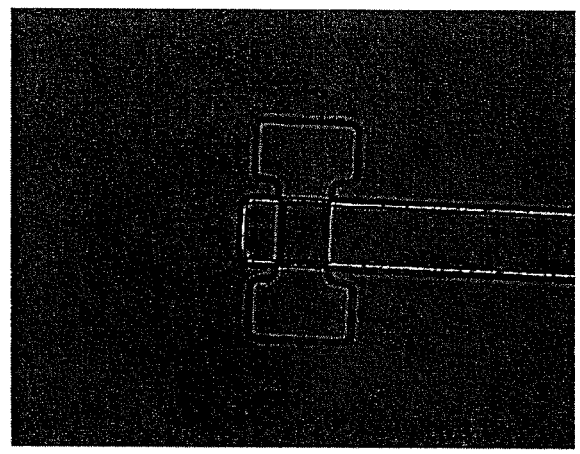

FIG. 32A shows the state after the first sacrifice layer etching and prior to the second sacrifice layer etching, and FIGS. 32B and 32C show the state after the second sacrifice layer etching. FIGS. 32A and 32B are photographs observed by an incident-light microscope and FIG. 32C is a photograph observed by a transmission microscope. FIGS. 32A and 32B are photographs each taken at 500-fold magnification of the incident-light microscope, and FIG. 32C is a photograph taken at 1000-fold magnification of the transmission microscope.

From FIG. 32A which shows the state after the first sacrifice layer etching and prior to the second sacrifice layer etching, it is understood that a part of the sacrifice layer 802 that does not overlap with the structural layer 803 has been removed by the first sacrifice layer etching. In FIG. 32A, the structural layer 803 is shown in white because of a tungsten mask stacked over the structural layer 803.

From FIGS. 32B and 32C which show the state after the second sacrifice layer etching, it is understood that the part of the sacrifice layer 802 that overlaps with the structural layer 803 has been removed, because the region where the sacrifice layer 802 overlaps with the structural layer 803 is not shown in white in FIG. 32B and the region where the sacrifice layer 802 overlaps with the structural layer 803 is not shown in black either in FIG. 32C.

Thus, it is confirmed from the comparison of the results between Experiment 1 and Experiment 2 that the sacrifice layer etching can be conducted more thoroughly by the present invention than by the conventional method.

Embodiment 2

Next, another experiment was conducted to confirm that sacrifice layer etching can be carried out in a shorter period of time to improve yield in the step of sacrifice layer etching by providing a plurality of microstructures within a substrate surface and moreover dividing the sacrifice layer etching into first sacrifice layer etching and second sacrifice layer etching.

Figure 30:
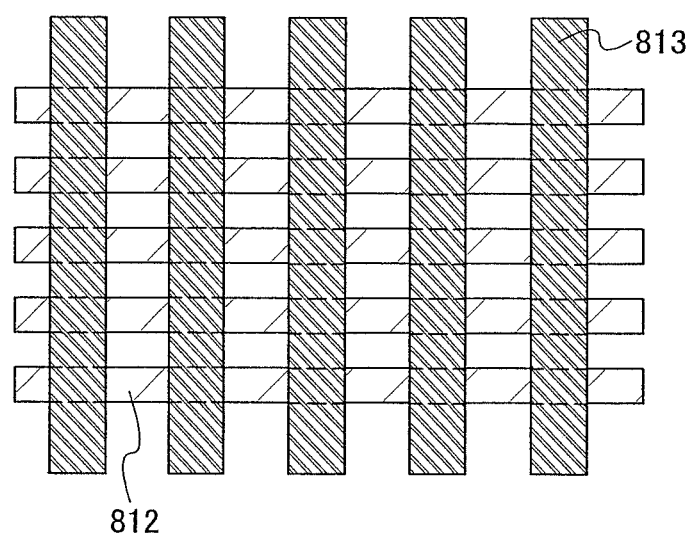
FIG. 30 shows an experiment of the present invention.

A measurement sample 3 to be used is a sample where a single structural body shown in FIG. 29A and a plurality of structural bodies provided in an array form shown in FIG. 30 are formed over one substrate. In the structural body shown in FIG. 30, a structural layer 813 was formed so as to intersect with a sacrifice layer 812; specifically, the sacrifice layer 812 and the structural layer 813 form a grid pattern. In the measurement sample 3, the distribution of the sacrifice layer 802 is not dense in a portion where the structural body shown in FIGS. 29A and 29B is formed and that of the sacrifice layer 812 is dense in a portion where the plurality of structural bodies shown in FIG. 30 are formed. The measurement sample 3 was formed in a similar manner to the measurement samples 1 and 2 used in Experiments 1 and 2, and obtained by forming each of the sacrifice layers 802 and 812 with tungsten of 1 µm thickness over a quartz substrate with a length of 5 inches on a side and forming each of the structural layers 803 and 813 with silicon oxynitride of 0.9 µm thickness over the sacrifice layers 802 and 812. In the measurement sample 3, the region where the sacrifice layer 802 overlaps with the structural layer 803 in a portion where the distribution of the sacrifice layer 802 is not dense, i.e., a portion where a single structural body is formed had a width of 6 µm and a length of 10 µm. Moreover, the region where the sacrifice layer 812 overlaps with the structural layer 813 in a portion where the distribution of the sacrifice layer 812 is dense, i.e., a portion where a plurality of structural bodies are formed had a width of 5 µm and a length of 8 µm. A conventional sacrifice layer etching method and a sacrifice layer etching method of the present invention in which the etching is conducted in two steps were compared using this measurement sample 3.

First, sacrifice layer etching is conducted by a conventional method using the above sample in Experiment 3. That is, the sacrifice layer etching is conducted under the same condition as that in Experiment 1.

Figure 33A:
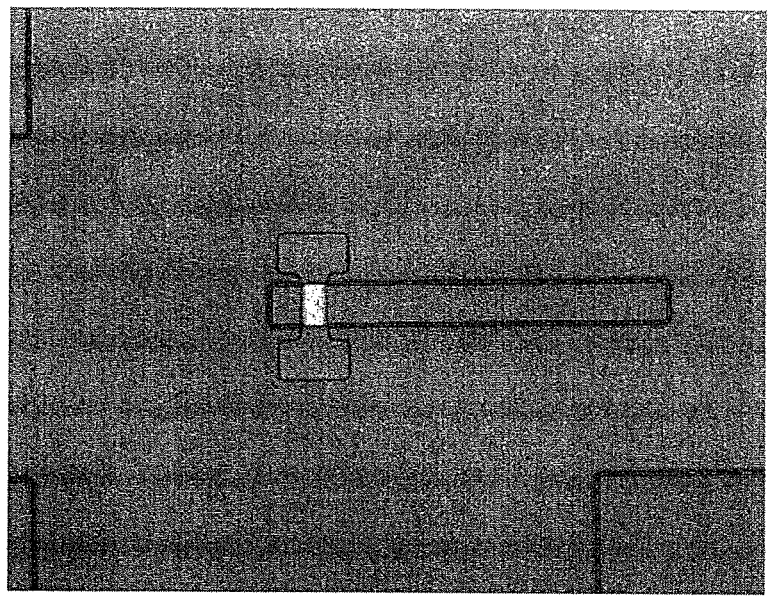
FIGS. 33A and 33B show an experiment of the present invention.
Figure 33B:
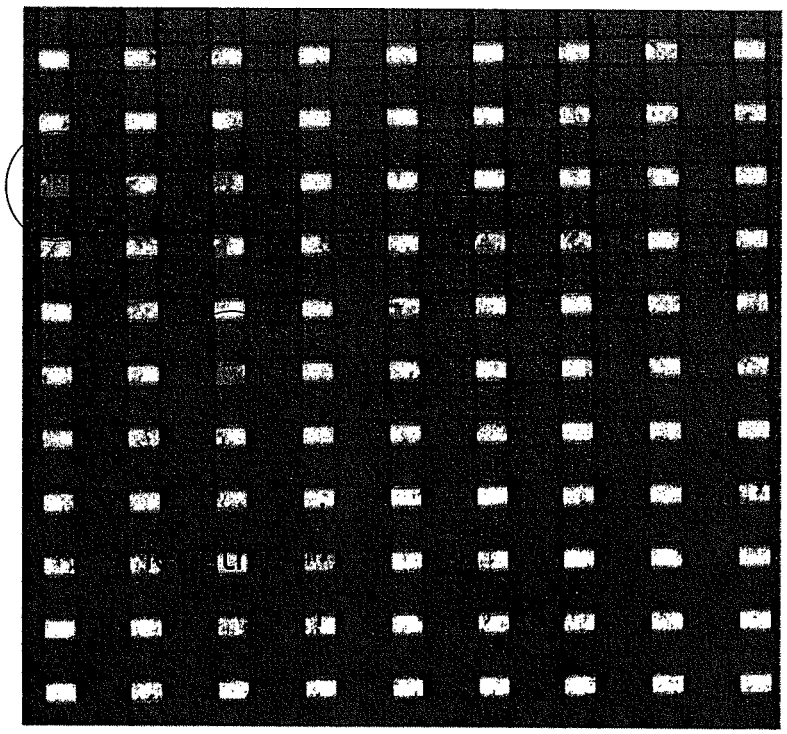

FIGS. 33A and 33B are photographs of observations made using an incident-light microscope each showing a state after the sacrifice layer etching in Experiment 3. Each of FIGS. 33A and 33B is a photograph taken at 500-fold magnification of the incident-light microscope. FIG. 33A is a photograph showing the portion where the distribution of the sacrifice layer 802 is not dense, i.e., the portion where a single structural body is formed. FIG. 33B is a photograph showing the portion where the distribution of the sacrifice layer 812 is dense, i.e., the portion where a plurality of structural bodies are formed. It is understood that the sacrifice layer is not removed, because the region where the sacrifice layer 802 overlaps with the structural layer 803 or the sacrifice layer 812 overlaps with the structural layer 813 is shown in white in FIGS. 33A and 33B.

Next, the same sample as that in Experiment 3 was used in Experiment 4 to carry out sacrifice layer etching in two steps. That is to say, the sacrifice layer etching is conducted under the same condition as that in Experiment 2.

Figure 34A:
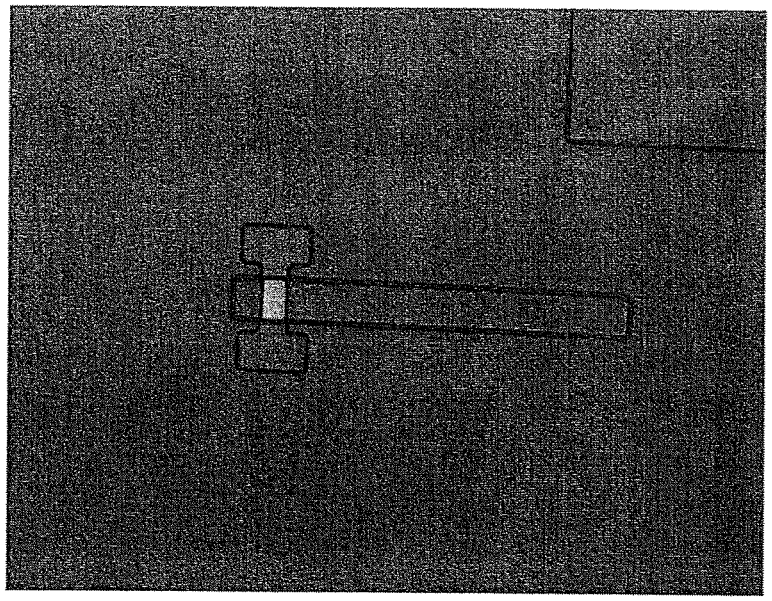
FIGS. 34A and 34B show an experiment of the present invention.
Figure 34B:
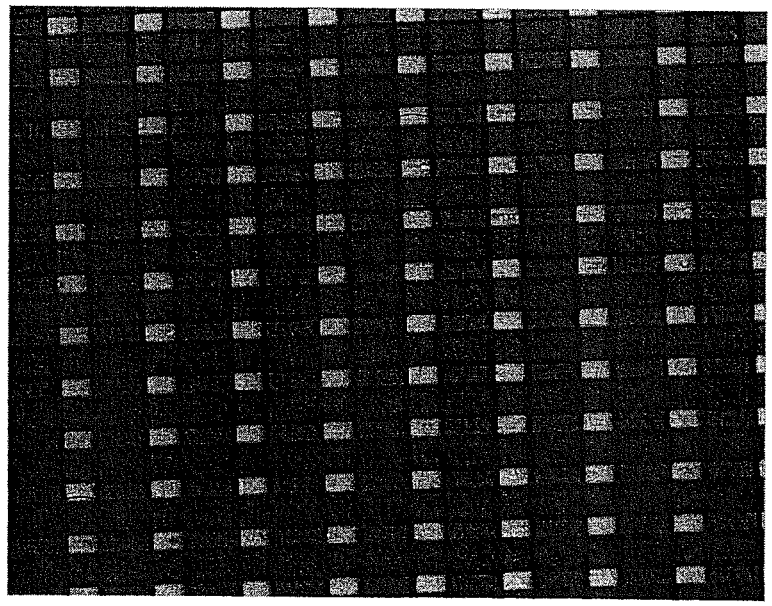

FIGS. 34A and 34B are photographs of observation made using an incident-light microscope each showing a state after the sacrifice layer etching in Experiment 4. Each of FIGS. 34A and 34B is a photograph taken at 500-fold magnification of the incident-light microscope. FIG. 34A is a photograph showing the portion where the distribution of the sacrifice layer 802 is not dense, i.e., the portion where a single structural body is formed. FIG. 34B is a photograph showing the portion where the distribution of the sacrifice layer 802 is dense, i.e., the portion where a plurality of structural bodies are formed. It is understood that the sacrifice layer has been removed, because the region where the sacrifice layer overlaps with the structural layer is shown in yellow-green if the photographs in FIGS. 34A and 34B are in color. Since black-and-white photographs are used in this specification, the photographs have an intermediate color between black and white. In this way, the sacrifice layer etching can be conducted with high accuracy even on the sample having different densities in the distribution of the sacrifice layer.

From the comparison between Experiment 3 and Experiment 4, it is possible to remove the sacrifice layer accurately and to improve the yield in the sacrifice layer etching step by using the method of the present invention even in the portion where the distribution of the sacrifice layer 812 is not dense.

This application is based on Japanese Patent Application serial no. 2005-312034 filed in Japan Patent Office on Oct. 26, 2005, the entire contents of which are hereby incorporated by reference.

What is claimed is:

1. A semiconductor device comprising:
   a first conductive layer over an insulating surface;
   an insulating layer over the first conductive layer;
   a second conductive layer over the insulating layer;
   a structural layer over the insulating layer;
   a third conductive layer on a bottom surface of the structural layer;
   wherein the second conductive layer faces the third conductive layer with a space therebetween,
   wherein a part of the bottom surface of the structural layer is in contact with the insulating layer, and
   wherein one lateral surface of the structural layer faces the other lateral surface of the structural layer with the space therebetween.

2. The semiconductor device, according to claim 1, wherein the semiconductor device is a micromachine.

3. The semiconductor device, according to claim 1, wherein the structural layer comprises at least one of a metal, an oxide of the metal, a nitride of the metal, a semiconductor material, an oxide of the semiconductor material, and a nitride of the semiconductor material.

4. The semiconductor device, according to claim 3, wherein the metal comprises at least one of titanium, aluminum, molybdenum, tungsten, and tantalum.

5. The semiconductor device, according to claim 3, wherein the semiconductor material comprises at least one of silicon and germanium.

6. The semiconductor device, according to claim 1, wherein the structural layer comprises an opening over the space.

7. The semiconductor device, according to claim 1,
   wherein the structural layer comprises an opening over the space,
   wherein the insulating layer comprises an depression, and
   wherein the depression and the opening overlap with each other.

8. A semiconductor device comprising:
   a first conductive layer over an insulating surface;
   an insulating layer over the first conductive layer;
   a second conductive layer over the insulating layer;
   a structural layer over the insulating layer;
   a third conductive layer on a bottom surface of the structural layer;
   a fourth conductive layer on the bottom surface of the structural layer,
   wherein the second conductive layer faces the fourth conductive layer with a space therebetween, wherein the first conductive layer faces the third conductive layer with the space and the insulating layer therebetween, wherein a part of the bottom surface of the structural layer is in contact with the insulating layer, and wherein one lateral surface of the structural layer faces the other lateral surface of the structural layer with the space therebetween.

9. The semiconductor device, according to claim 8, wherein the semiconductor device is a micromachine.

10. The semiconductor device, according to claim 8, wherein the structural layer comprises at least one of a metal, an oxide of the metal, a nitride of the metal, a semiconductor material, an oxide of the semiconductor material, and a nitride of the semiconductor material.

11. The semiconductor device, according to claim 10, wherein the metal comprises at least one of titanium, aluminum, molybdenum, tungsten, and tantalum.

12. The semiconductor device, according to claim 10, wherein the semiconductor material comprises at least one of silicon and germanium.

13. The semiconductor device, according to claim 8, wherein the structural layer comprises an opening over the space.

14. The semiconductor device, according to claim 8,
wherein the structural layer comprises an opening over the space, wherein the insulating layer comprises an depression, and wherein the depression and the opening overlap with each other.

* * * * *